United States Patent
Sharangpani et al.

(10) Patent No.: US 9,524,977 B2
(45) Date of Patent: Dec. 20, 2016

(54) METAL-SEMICONDUCTOR ALLOY REGION FOR ENHANCING ON CURRENT IN A THREE-DIMENSIONAL MEMORY STRUCTURE

(71) Applicant: SanDisk Technologies, Inc., Plano, TX (US)

(72) Inventors: Rahul Sharangpani, Fremont, CA (US); Raghuveer S. Makala, Campbell, CA (US); Sateesh Koka, Milpitas, CA (US); Tomohiro Kubo, Yokkaichi (JP); Junichi Ariyoshi, Yokkaichi (JP); George Matamis, Danville, CA (US)

(73) Assignee: SANDISK TECHNOLOGIES LLC, Plano, TX (US)

(*) Notice: Subject to any disclaimer, the term of this patent is extended or adjusted under 35 U.S.C. 154(b) by 0 days.

(21) Appl. No.: 14/687,403

(22) Filed: Apr. 15, 2015

(65) Prior Publication Data

US 2016/0307908 A1   Oct. 20, 2016

(51) Int. Cl.
*H01L 27/115* (2006.01)

(52) U.S. Cl.
CPC ..... *H01L 27/1157* (2013.01); *H01L 27/11524* (2013.01); *H01L 27/11556* (2013.01); *H01L 27/11582* (2013.01)

(58) Field of Classification Search
CPC ............ H01L 27/1157; H01L 27/11524; H01L 27/11556; H01L 27/11582
See application file for complete search history.

(56) References Cited

U.S. PATENT DOCUMENTS

| | | | |
|---|---|---|---|
| 5,915,167 | A | 6/1999 | Leedy |
| 8,349,681 | B2 | 1/2013 | Alsmeier et al. |
| 8,658,499 | B2 | 2/2014 | Makala et al. |
| 8,928,061 | B2 | 1/2015 | Chien et al. |

(Continued)

OTHER PUBLICATIONS

U.S. Appl. No. 14/519,733, filed Oct. 21, 2014, SanDisk Technologies Inc.

(Continued)

*Primary Examiner* — Peter Bradford
(74) *Attorney, Agent, or Firm* — The Marbury Law Group PLLC

(57) ABSTRACT

Resistance of a semiconductor channel in three-dimensional memory stack structures can be reduced by forming a metal-semiconductor alloy region between a vertical semiconductor channel and a horizontal semiconductor channel located within a substrate. The metal-semiconductor alloy region can be formed by recessing a portion of the semiconductor material layer in the semiconductor substrate underneath a memory opening after formation of a memory film, selectively depositing a metallic material in the recess region, depositing a vertical semiconductor channel, and reacting the deposited metallic material with an adjacent portion of the semiconductor material layer and the vertical semiconductor channel. A sacrificial dielectric material layer can be formed on the memory film prior to the selective deposition of the metallic material. The vertical semiconductor channel can be formed in a single deposition process, thereby eliminating any interface therein and minimizing the resistance of the vertical semiconductor channel.

22 Claims, 18 Drawing Sheets

(56) References Cited

U.S. PATENT DOCUMENTS

| | | | |
|---|---|---|---|
| 9,224,752 B1* | 12/2015 | Lee | H01L 27/11582 |
| 2011/0024818 A1* | 2/2011 | Ahn | H01L 21/28273 |
| | | | 257/314 |
| 2012/0001249 A1* | 1/2012 | Alsmeier | H01L 27/11551 |
| | | | 257/319 |
| 2013/0264631 A1 | 10/2013 | Alsmeier et al. | |
| 2014/0054673 A1* | 2/2014 | Kim | H01L 29/792 |
| | | | 257/324 |
| 2014/0225181 A1 | 8/2014 | Makala et al. | |
| 2014/0264547 A1 | 9/2014 | Kawai et al. | |
| 2015/0060977 A1 | 3/2015 | Lee et al. | |
| 2015/0061155 A1 | 3/2015 | Seo et al. | |

OTHER PUBLICATIONS

U.S. Appl. No. 14/600,226, filed Jan. 20, 2015, SanDisk Technologies Inc.

Endoh et al., "Novel Ultra High Density Memory with a Stacked-Surrounding Gate Transistor (S-SGT) Structured Cell," IEDM Proc. (2001) 33-36.

International Search Report and the Written Opinion of the International Search Authority for International Application No. PCT/US2016/025394, 14 pages, dated Jun. 8, 2016.

* cited by examiner

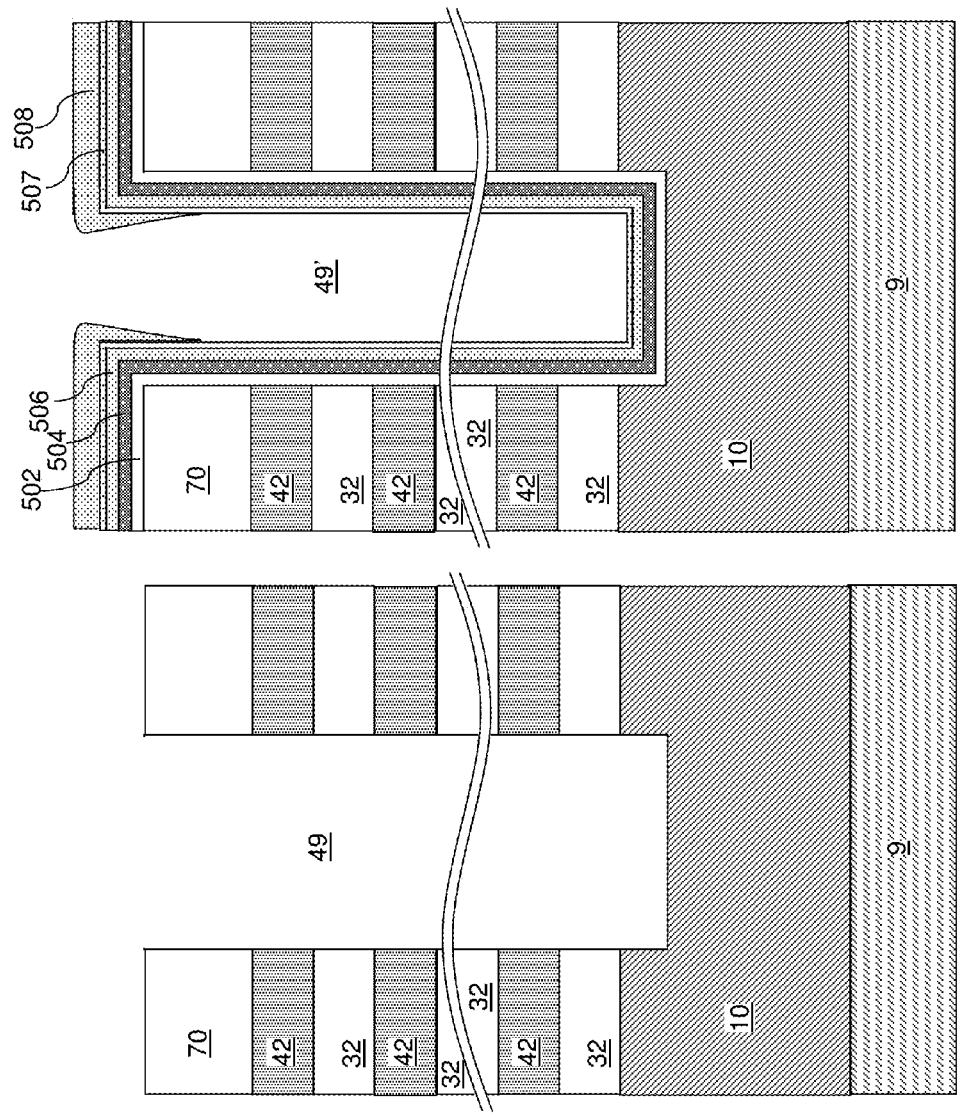

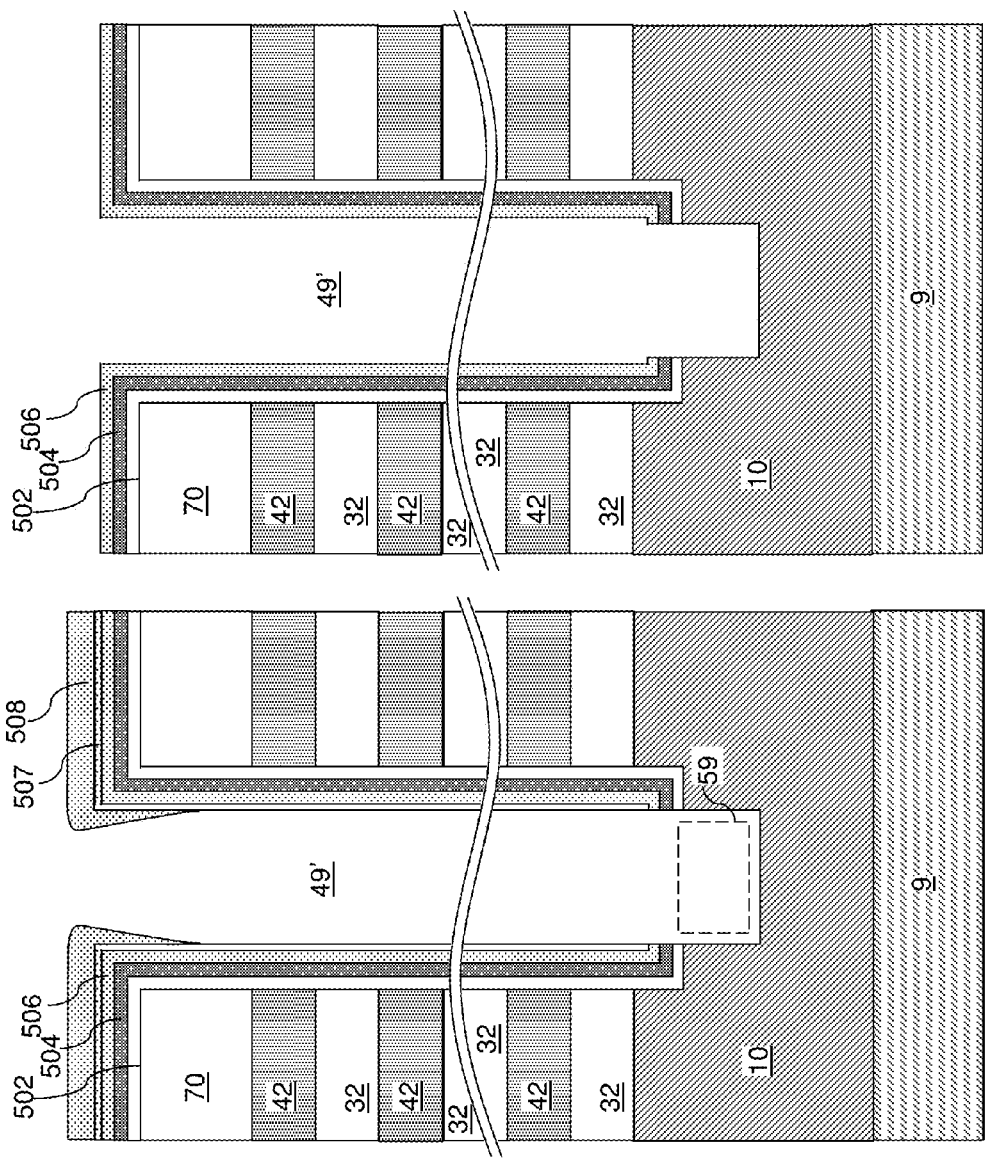

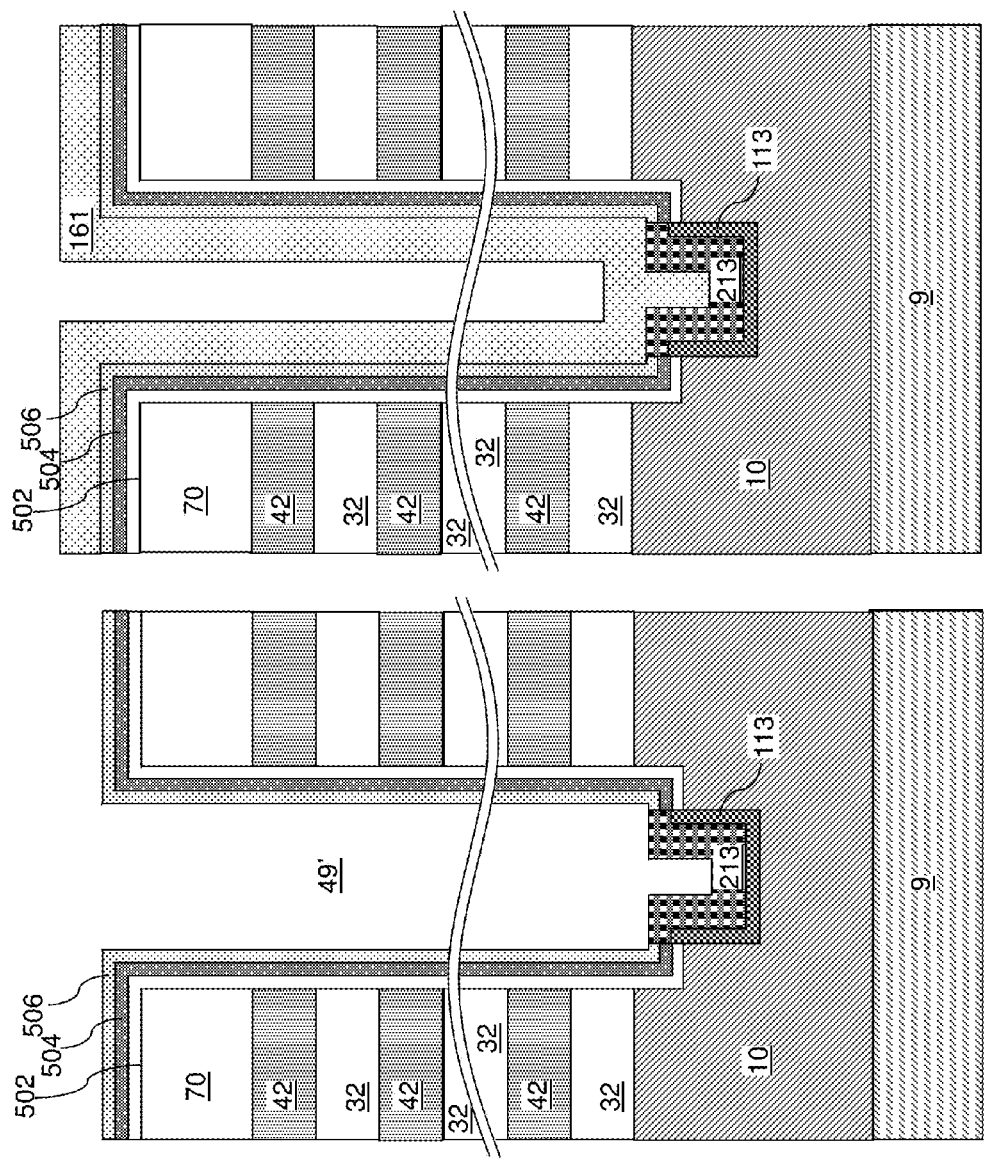

METAL-SEMICONDUCTOR ALLOY REGION FOR ENHANCING ON CURRENT IN A THREE-DIMENSIONAL MEMORY STRUCTURE

FIELD

The present disclosure relates generally to the field of semiconductor devices and specifically to three-dimensional memory structures, such as vertical NAND strings and other three-dimensional devices, and methods of making thereof.

BACKGROUND

Three-dimensional vertical NAND strings having one bit per cell are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a monolithic three-dimensional memory device, comprises a substrate including a semiconductor material, a stack of alternating layers comprising insulator layers and electrically conductive layers located over the semiconductor material of the substrate, a memory opening extending through the stack, a semiconductor channel located within the memory opening, and a memory film located within the memory opening. A metal-semiconductor alloy region is located between and contacts the semiconductor material of the substrate and the semiconductor channel.

According to another aspect of the present disclosure, a method of manufacturing a three-dimensional structure is provided. A stack of alternating layers comprising first material layers and second material layers is formed over a substrate that includes a semiconductor material. A memory opening extending through the stack is formed. A memory film is formed in the memory opening. At least one metallic material is formed on the semiconductor material of the substrate. A semiconductor channel is formed in the memory opening. A metal-semiconductor alloy region is formed by reacting the at least one metallic material with a portion of the semiconductor material of the substrate.

BRIEF DESCRIPTION OF THE DRAWINGS

FIGS. 3A-3H are sequential vertical cross-sectional views of a memory opening within the exemplary structure during various processing steps employed to form a first exemplary memory stack structure according to a first embodiment of the present disclosure.

FIGS. 4A-4F are sequential vertical cross-sectional views of a memory opening within the exemplary structure during various processing steps employed to form a second exemplary memory stack structure according to a second embodiment of the present disclosure.

DETAILED DESCRIPTION

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Figure 1:
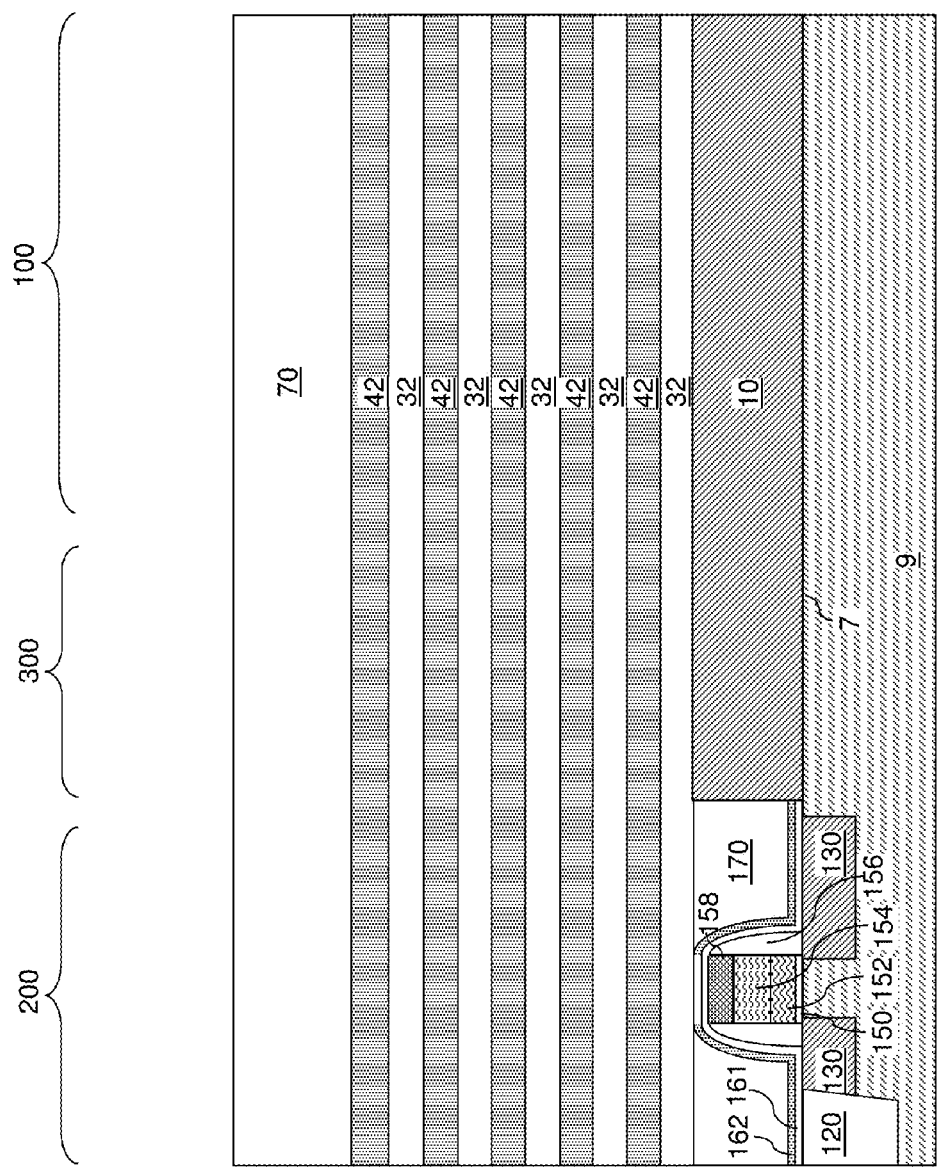
FIG. 1 is a vertical cross-sectional view of an exemplary structure after formation of an alternating stack of first material layers and second material layers and an insulating cap layer according to a first embodiment of the present disclosure.

Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate, such as a semiconductor (e.g., silicon) wafer. The substrate can include a substrate semiconductor layer 9. The substrate semiconductor layer 9 is a semiconductor material layer or a top portion of the semiconductor wafer (i.e., the term "layer" includes but is not limited to a semiconductor thin film deposited over a substrate). The substrate semiconductor layer 9 can include at least one elemental semiconductor material (e.g., silicon), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface.

As used herein, a "semiconductor material" refers to a material having electrical conductivity in the range from $1.0 \times 10^{-6}$ S/cm to $1.0 \times 10^{5}$ S/cm, and is capable of producing a doped material having electrical resistivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer 9.

At least one semiconductor device for a peripheral circuitry can be formed in a region of the exemplary structure, which is herein referred to as a peripheral device region 200. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric 158. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a conformal dielectric layer.

Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

As used herein, a dielectric metal oxide refers to a dielectric material that includes at least one metal element and at least oxygen. The dielectric metal oxide may consist essentially of the at least one metal element and oxygen, or may consist essentially of the at least one metal element, oxygen, and at least one non-metal element such as nitrogen. Dielectric metal oxide can have a dielectric constant greater than 7.9, i.e., can have a dielectric constant greater than the dielectric constant of silicon nitride. Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. Dielectric metal oxides can be deposited, for example, by chemical vapor deposition (CVD), atomic layer deposition (ALD), pulsed laser deposition (PLD), liquid source misted chemical deposition, or a combination thereof.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

The exemplary structure further includes a device region 100 in which an array of memory stack structures is to be subsequently formed, and a contact region 300 in which stepped surfaces of electrically conductive layers and contact via structures are to be subsequently formed. An optional semiconductor material layer 10 can be formed in the device region 100 and the contact region 300. The optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 70 can be removed, for example, by chemical mechanical planarization (CMP). In this case, the semiconductor material layer 10 can have a top surface that is coplanar with the top surface of the planarization dielectric layer 170. As used herein, the optional semiconductor material layer 10 comprises a portion of the substrate, and may comprises a semiconductor thin film deposited over the substrate semiconductor layer 9 (e.g., over a semiconductor wafer) and/or or an ion implanted well in the substrate semiconductor layer 9 having the same or opposite conductivity type to the source and drain regions of the memory device that will be described below (i.e., the term "layer 10" includes but is not limited to a semiconductor thin film deposited over the substrate).

In embodiments in which the semiconductor material layer 10 is not formed, the substrate semiconductor layer 9 can performed the function of the semiconductor layer 10. Accordingly, while the present disclosure is described employing an embodiment in which the semiconductor material layer 10 is present, embodiments are expressly contemplated herein in which the substrate semiconductor layer 9 is employed in lieu of the semiconductor layer 10.

A dielectric liner (not shown) can be optionally formed above the semiconductor material layer 10 and optionally above the planarization dielectric layer 170. The dielectric liner, if present, can be, for example, silicon oxide layer or a dielectric metal oxide layer. The dielectric liner can be formed by conversion of a surface portion of a semiconductor material within a semiconductor substrate (9, 10) (such as a surface portion of the semiconductor material layer 10), and/or by deposition of a dielectric material, for example, by chemical vapor deposition (CVD) and/or atomic layer deposition.

A stack of an alternating plurality of first material layers (which can be insulator layers 32) and second material layers (which can be spacer material layers 42) is formed over the top surface of the substrate. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulator layer 32, and each second material layer (i.e., each spacer material layer 42) can be a sacrificial material layer. In this case, the stack can include an alternating plurality of insulator layers 32 and spacer material layers 42 that include a sacrificial material.

The stack of the alternating plurality is herein referred to as an alternating stack (32, 42). In one embodiment, the alternating stack (32, 42) can include insulator layers 32 composed of the first material, and spacer material layers 42 composed of a second material different from that of insulator layers 32. The first material of the insulator layers 32 can be at least one electrically insulating material. As such, each insulator layer 32 can be an electrically insulating material layer. Electrically insulating materials that can be employed for the insulator layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulator layers 32 can be silicon oxide.

The second material of the spacer material layers 42 is a sacrificial material that can be removed selective to the first material of the insulator layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The spacer material layers 42 may comprise an electrically insulating material, a semiconductor material, or a conductive material. The second material of the spacer material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the spacer material layers 42 can be material layers that comprise silicon nitride or a semiconductor material including at least one of silicon and germanium.

In one embodiment, the insulator layers 32 can include silicon oxide, and sacrificial material layers can include silicon nitride sacrificial material layers. The first material of the insulator layers 32 can be deposited, for example, by chemical vapor deposition (CVD). For example, if silicon oxide is employed for the insulator layers 32, tetraethyl orthosilicate (TEOS) can be employed as the precursor material for the CVD process. The second material of the spacer material layers 42 can be formed, for example, CVD or atomic layer deposition (ALD).

The spacer material layers 42 can be suitably patterned so that conductive material portions to be subsequently formed by replacement of the spacer material layers 42 can function as electrically conductive electrodes, such as the control gate electrodes of the monolithic three-dimensional NAND string memory devices to be subsequently formed. The spacer material layers 42 may comprise a portion having a strip shape extending substantially parallel to the major surface 7 of the substrate.

The thicknesses of the insulator layers 32 and the spacer material layers 42 can be in a range from 20 nm to 50 nm, although lesser and greater thicknesses can be employed for each insulator layer 32 and for each spacer material layer 42. The number of repetitions of the pairs of an insulator layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each spacer material layer 42 in the alternating stack (32, 42) can have a uniform thickness that is substantially invariant within each respective spacer material layer 42.

Optionally, an insulating cap layer 70 can be formed over the alternating stack (32, 42). The insulating cap layer 70 includes a dielectric material that is different from the material of the spacer material layers 42. In one embodiment, the insulating cap layer 70 can include a dielectric material that can be employed for the insulator layers 32 as described above. The insulating cap layer 70 can have a greater thickness than each of the insulator layers 32. The insulating cap layer 70 can be deposited, for example, by chemical vapor deposition. In one embodiment, the insulating cap layer 70 can be a silicon oxide layer.

Figure 2:
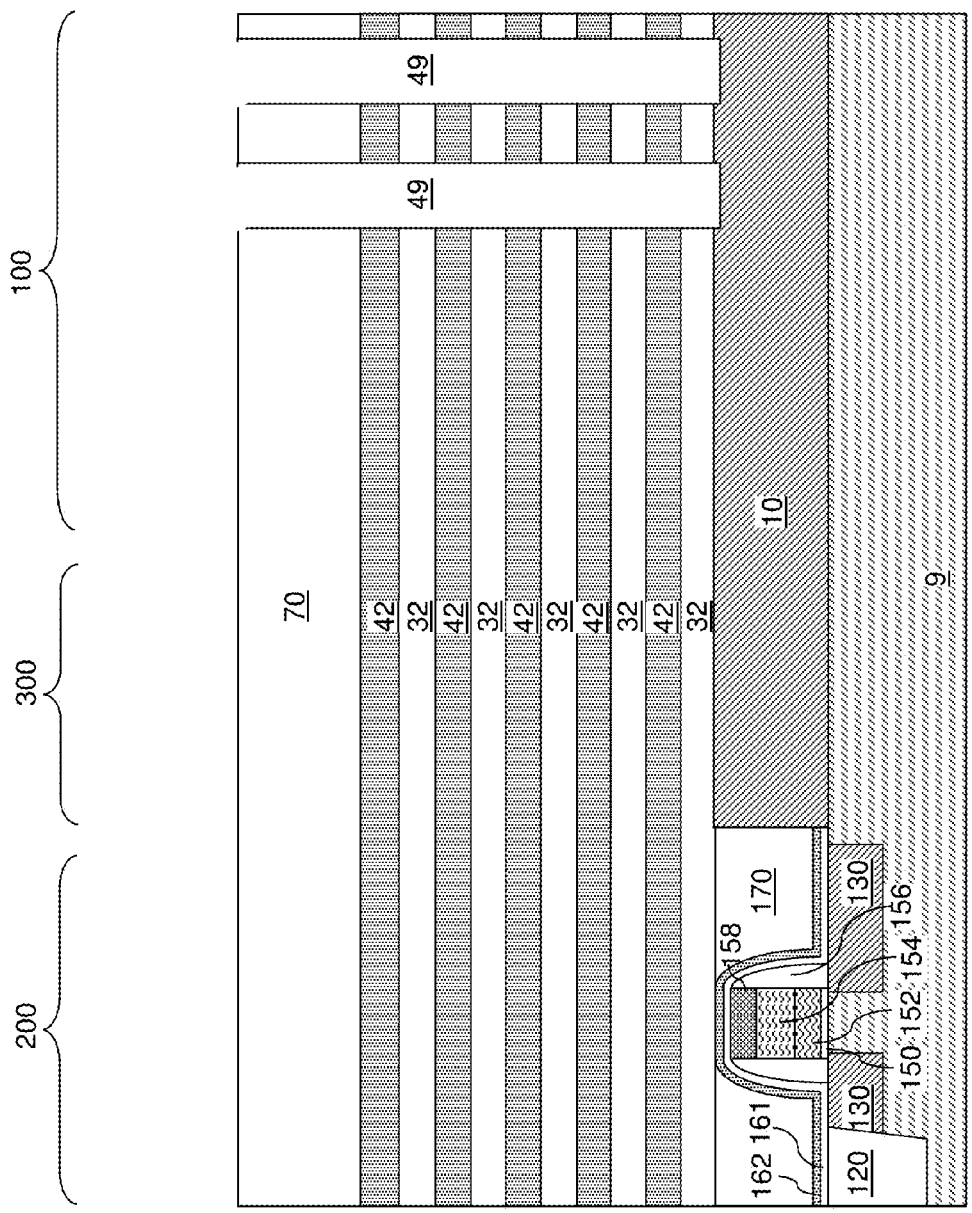
FIG. 2 is a vertical cross-sectional view of the exemplary structure after formation of memory openings according to the first embodiment of the present disclosure.

Referring to FIG. 2, a lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. In one embodiment, the etch chemistry can employ a hydrofluorocarbon based etchant gas or a hydrochlorocarbon based etchant gas. The memory openings 49 can be formed as a two-dimensional array.

A memory stack structure can be formed in each of the memory opening employing various embodiments of the present disclosure. Formation of memory stack structures can be simultaneously performed within each of the memory openings 49 in the exemplary structure illustrated in FIG. 2.

Figure 3F:
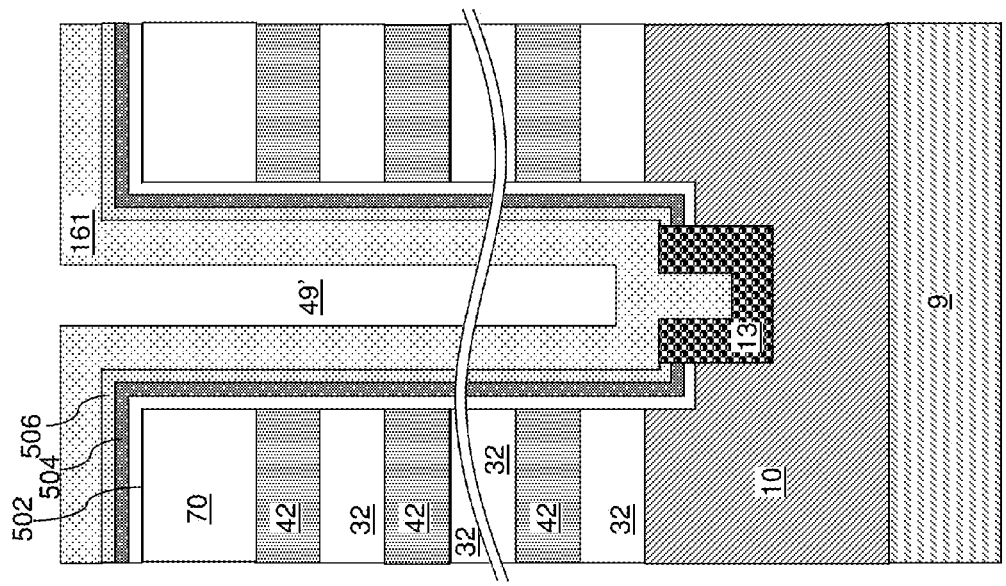

FIGS. 3A-3H illustrate sequential vertical cross-sectional views of a memory opening within the exemplary structure during formation of a first exemplary memory stack structure according to a first embodiment of the present disclosure. Referring to FIG. 3A, a memory opening 49 after the processing steps of FIG. 2 is illustrated. The memory opening 49 extends through the insulating cap layer 70 and the alternating stack (32, 42), and into an upper portion of the substrate (9, 10). The bottom surface of the memory opening 49 can be coplanar with the top surface of the semiconductor material layer 10.

Referring to FIG. 3B, a layer stack including at least one blocking dielectric layer 502, a memory material layer 504, a tunneling dielectric layer 506, and an optional sacrificial dielectric material layer 507 can be sequentially deposited in the memory openings 49. In one embodiment, each of the at least one blocking dielectric layer 502, the memory material layer 504, the tunneling dielectric layer 506, and the sacrificial dielectric material layer 507 can be deposited by a conformal deposition method such as atomic layer deposition or chemical vapor deposition. The at least one blocking dielectric layer 502 can include a single blocking dielectric layer or a layered stack of a plurality of blocking dielectric layers.

The at least one blocking dielectric layer 502 can be deposited on the sidewalls of each memory opening 49 by a conformal deposition method. The at least one blocking dielectric layer 502 includes a dielectric material, which can be silicon oxide and/or a dielectric metal oxide. In one embodiment, the at least one blocking dielectric layer 502 can include a stack including, from outside to inside, a dielectric metal oxide layer and a silicon oxide layer. In one embodiment, the dielectric metal oxide layer can be an aluminum oxide layer. The thickness of the at least one blocking dielectric layer 502 can be in a range from 3 nm to 12 nm, although lesser and greater thicknesses can also be employed.

In one embodiment, the memory material layer 504 can be a charge trapping material including a dielectric charge trapping material, which can be, for example, silicon nitride. Alternatively, the memory material layer 504 can include a conductive material such as doped polysilicon or a metallic material that is patterned into multiple electrically isolated portions (e.g., floating gates), for example, by being formed within lateral recesses into spacer material layers 42. In one embodiment, the memory material layer 504 includes a silicon nitride layer.

The memory material layer 504 can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 504 may comprise an insulating charge trapping material, such as one or more silicon nitride segments. Alternatively, the memory material layer 504 may comprise conductive nanoparticles such as metal nanoparticles, which can be, for example, ruthenium nanoparticles. The memory material layer 504 can be formed, for example, by chemical vapor deposition (CVD), atomic layer deposition (ALD), physical vapor deposition (PVD), or any suitable deposition technique for storing electrical charges therein. The thickness of the memory material layer 504 can be in a range from 2 nm to 20 nm, although lesser and greater thicknesses can also be employed.

The tunneling dielectric layer 506 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 506 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 506 can include a stack of a first silicon oxide layer, a silicon oxynitride layer, and a second silicon oxide layer, which is commonly known as an ONO stack. In one embodiment, the tunneling dielectric layer 506 can include a silicon oxide layer that is substantially free of carbon or a silicon oxynitride layer that is substantially free of carbon. The thickness of the tunneling dielectric layer 506 can be in a range from 2 nm to 20 nm, although lesser and greater thicknesses can also be employed. The set of the at least one blocking dielectric layer 502, the memory material layer 504, and the tunneling dielectric layer 506 collectively constitutes a memory film (502, 504, 506), which is a contiguous layer stack that overlies the insulating cap layer 70 and including vertical portions that extend vertically into the memory openings 49 to cover all inner surfaces of the memory openings 49.

The optional sacrificial dielectric material layer 507, if present, is deposited on the physically exposed surfaces of the tunneling dielectric layer 506. The sacrificial dielectric material layer 507 includes a material that can protect the tunneling dielectric layer 506 during subsequent etch processes that vertically recesses the cavity 49' within the memory opening 49. In one embodiment, the sacrificial dielectric material layer 507 can comprise amorphous carbon and/or diamond-like carbon (DLC), and can have a thickness in a range from 1 nm to 10 nm, although lesser and greater thicknesses can also be employed.

A sacrificial non-conformal material layer 508 can be deposited by an anisotropic deposition method. The sacrificial non-conformal material layer 508 can be deposited by a highly depletive deposition method that deposits a material at the topmost surface of the exemplary structure, while minimizing, or eliminating, deposition of the material on the vertical sidewall and the bottom surface of each cavity 49'. The sacrificial non-conformal material layer 508 serves as a hard mask to protect the part of layers 502, 504 and 506 which are located on the top surface of the stack. Specifically, layer 508 protects layers 502, 504 and 506 on top of the stack during the subsequent etching step at the bottom of the cavity 49' shown in FIG. 3C. Preferably, layer 508 is only deposited over the top surface of the stack with no material present on the sidewalls of the cavity 49'. Alternatively, some material of layer 508 deposits on the sidewalls of the cavity 49', especially near the top of the cavity 49', as shown in FIG. 3B. In one embodiment, the sacrificial non-conformal material layer 508 can comprise a carbon layer, such as an Advanced Patterning Film™ by Applied Materials, Inc. Each cavity 49' is contiguously adjoined to the ambient above the top surface of the sacrificial non-conformal material layer 508 by an opening within the sacrificial non-conformal material layer 508, through which etchant ions can pass during a subsequent anisotropic etch process that etches the horizontal portions of the layer stack (502, 504, 506, 507) at the bottom of the memory opening 49.

Referring to FIG. 3C, an anisotropic etch can be performed to etch the horizontal portions of the layer stack (502, 504, 506, 507) at the bottom of the memory opening 49. The sacrificial non-conformal material layer 508 and/or the sacrificial dielectric material layer 507 can protect the tunneling dielectric layer 506, the memory material layer 504, and the at least one blocking dielectric layer 502 from the reactive ions during the anisotropic etch. The anisotropic etch process is further continued to etch a portion of the semiconductor material layer 10 underneath the memory opening 49 to form a recess region 59. If the semiconductor material layer 10 is omitted, then the recess region extends into the substrate semiconductor layer 9. Optionally, the anisotropic etch process can employ different etch chemistries for etching of the horizontal portions of the layers (502, 504, 506, 507) and for etching the semiconductor material of the semiconductor material layer 10. The sacrificial non-conformal material layer 508, if present, can be employed as an etch mask during the anisotropic etch. The sacrificial dielectric material layer 507 protects the memory film (502, 504, 506) during the anisotropic etch. The depth of recess in the recess region 59, i.e., the vertical distance between a horizontal interface between the memory film (502, 504, 506) and the semiconductor material layer 10 (or layer 9 if layer 10 is omitted) and the bottom surface of the recess region 59, can be in a range from 10 nm to 100 nm (such as from 20 nm to 60 nm), although lesser and greater thicknesses can also be employed.

Referring to FIG. 3D, the sacrificial non-conformal material layer 508 and the sacrificial dielectric material layer 507 can be removed selective to the memory film (502, 504, 506). In case the sacrificial non-conformal material layer 508 and the sacrificial dielectric material layer 507 comprise carbon or carbon-based material, the sacrificial non-conformal material layer 508 and the sacrificial dielectric material layer 507 can be removed by ashing. The lateral dimension of the cavity 49' between sidewalls of the memory film (502, 504, 506) can be in a range from 10 nm to 100 nm (such as from 20 nm to 60 nm), although lesser and greater lateral dimensions can also be employed. An opening 49a remains in the horizontal portion of the layers (502, 504, 506).

Figure 3E:
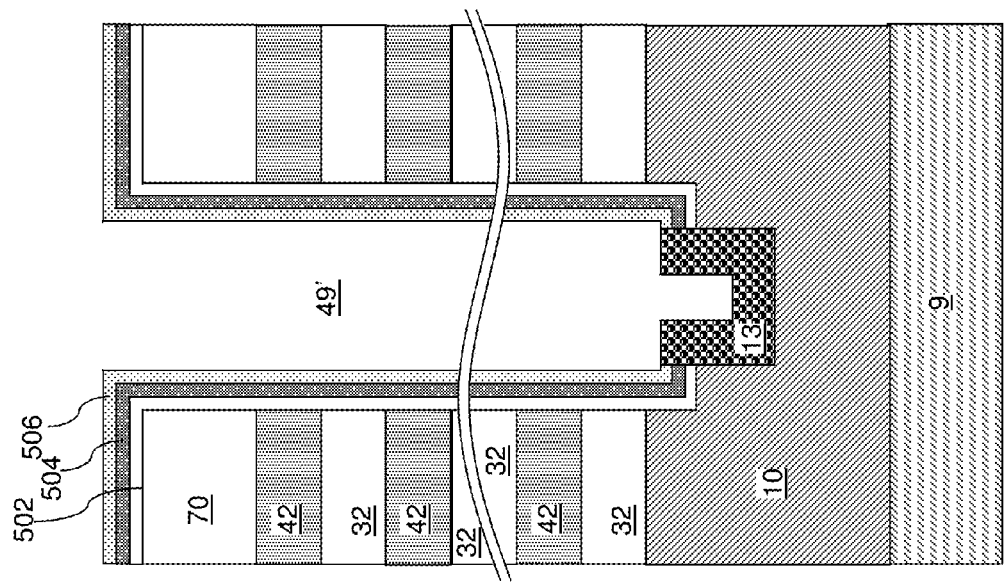

Referring to FIG. 3E, at least one metallic material can be deposited on a semiconductor material of the semiconductor material layer 10 in the recess region 59 while preventing depositing the at least one metallic material over the stack. The deposition of the at least one metallic material can be performed by a selective deposition process that induces growth of the at least one metallic material from surfaces of semiconductor materials while inhibiting growth of the at least one metallic material on dielectric surfaces. Thus, the at least one metallic material can grow from the sidewalls and the bottom surface of the recess region 59, and does not grow from the dielectric surfaces of the tunneling dielectric layer 506. In case the memory film (502, 504, 506) consists of dielectric materials, the at least one metallic material does not grow from any surface of the memory film (502, 504, 506).

The selectively deposited at least one metallic material forms a metallic material portion 13 located on the sidewalls and the bottom surface of the recess region 506 within the semiconductor material layer 10. The selectively deposited at least one metallic material forms a metallic material portion 13 that contacts the sidewalls and a horizontal (i.e., bottom) surface of the semiconductor material layer 10 in the recess region 59. In other words, the at least one metallic material does not grow from a physically exposed surface of the tunneling dielectric layer 506 during selective deposition of the at least one metallic material. In one embodiment, the selectively deposited at least one metallic material comprises one or more metal element selected from tungsten, ruthenium, and cobalt.

Selective deposition of tungsten on semiconductor surfaces without deposition on dielectric surfaces can be performed by a selective chemical vapor deposition (CVD) process. For example, tungsten may be selectively deposited on exposed silicon only using a tungsten hexafluoride source gas for CVD. Using tungsten hexafluoride gas in a CVD process deposits tungsten on exposed silicon with no deposition on the exposed oxide layers using the following reaction $WF_6$ (g)+Si (solid surface)=W (solid layer)+$SiF_4$ (g). This reaction is self-limiting and can be made to stop at any thickness between 5-30 nm by adjusting the deposition temperature. The deposited tungsten layer may be the complete metal layer or it may be used as a seed layer to selectively deposit an additional metal layer on its surface. The additional metal layer may comprise tungsten deposited by a fluorine free source CVD process or by atomic layer deposition ("ALD") process.

Selective deposition of ruthenium can be performed by an atomic layer deposition process. Deposition of the ruthenium layer can be performed by ALD by supplying a volatile ruthenium precursor, such as $RuO_4$ into a reaction chamber in which the exemplary structure is placed. One or more $RuO_2$ monolayers may be formed using atomic layer deposition. The one or more $RuO_2$ monolayers may be exposed to a reducing atmosphere to fully reduce the deposited one or more $RuO_2$ monolayers to one or more Ru monolayers. The $RuO_2$ deposition and Ru reducing steps (i.e., 1 atomic layer deposition cycle) may be repeated multiple times. A hydrogen based forming gas, such as 2%-5% (such as 4%) hydrogen and 95%-98% (such as 96%) nitrogen, may be supplied as the reducing atmosphere for the ruthenium. In one embodiment, the atomic layer deposition is performed by cycling, such as with more than 25 cycles (such as 30 cycles-55 cycles) to form a contiguous layer of Ru, i.e., a ruthenium layer that grows selectively from semiconductor surfaces and does not grow from dielectric surfaces.

Deposition of cobalt can be performed by chemical vapor deposition (CVD) or atomic layer deposition (ALD). Chemical vapor deposition or atomic layer deposition of cobalt employs a cobalt precursor that can be easily vaporized to leave high-purity cobalt on a surface without causing surface damage. In one embodiment, an organometallic compound with relatively high vapor pressures and good thermal stability can be employed as the cobalt precursor gas to deposit cobalt without requiring hydrogen. In a non-limiting example, bis(cyclopentadienyl)cobalt, bis(ethylcyclopentadienyl)cobalt, bis(ethylcyclopentadienyl)cobalt, or bis(pentamethylcyclopentadienyl)cobalt can be employed as a cobalt precursor gas in a CVD or ALD process. Alternatively, different precursor gases (such as $Co_2(CO)_8$) can also be employed for cobalt deposition.

Nucleation of cobalt requires a metallic surface or a semiconductor surface. Thus, cobalt grows only from the semiconductor surfaces of the recess region 59, and do not grow from the surfaces of the tunneling dielectric layer 506. Depending on process conditions, the selectivity of cobalt deposition may be limited, and as the thickness of deposited cobalt increases (for example, above 7 nm), islands of cobalt may begin to nucleate on the surfaces of the tunneling dielectric layer 506.

The thickness of the metallic material portion 13, as measured on the sidewalls and the bottom surface of the recess region 59, can be in a range from 2 nm to 20 nm (for example, from 4 nm to 10 nm), although lesser and greater thicknesses can also be employed. In one embodiment, the recess region 59 may not be completely filled with the metallic material portion 13, and thus, may contain an unfilled volume that is an extension of the cavity 49' contained within a portion of the memory film (502, 504, 506) within a memory opening 49.

The metallic material portion 13 can be formed by a single selective deposition step that deposits a single metallic material (such as tungsten, ruthenium, or cobalt), or can be formed by a plurality of deposition steps that deposits a plurality of metallic materials having different compositions. For example, the metallic material portion 13 can include a stack of a first metallic material (such as one of tungsten, ruthenium, and cobalt) and a second metallic material (such as another of tungsten, ruthenium, and cobalt). For example, W or Ru may be used as the initial metal seed layer on the recessed silicon for a selectively deposited Co layer. This would have the advantage of allowing better Co nucleation since Co selectively deposits more easily on a metal seed layer compared to on an exposed silicon region.

Referring to FIG. 3F, an as-deposited semiconductor channel material layer 161 can be formed on the metallic material portion 13, and on the memory film (502, 504, 506). In one embodiment, the as-deposited semiconductor channel material layer 161 can be formed by a single semiconductor material deposition process that is performed after deposition of the at least one metallic material. In one embodiment, the as-deposited semiconductor channel material layer 161 can be an amorphous semiconductor material layer, and can be intrinsic, or can have a doping of the same or opposite conductivity type as the semiconductor material layer 10. For example, the as-deposited semiconductor channel material layer 161 can be an intrinsic semiconductor material layer, or can have a p-type doping. In one embodiment, the single semiconductor material deposition process comprises an amorphous silicon layer deposition process. If the semiconductor channel material layer 161 has p-type doping, then the semiconductor material layer 10 may comprise a deposited or implanted p-type well which forms a horizontal portion of the semiconductor channel between a source region and a vertical portion of the semiconductor channel. Alternatively, the semiconductor material layer 10 may comprise a deposited or implanted n-type well which forms a horizontal source line which contacts a lower part of the vertical portion of the semiconductor channel.

The as-deposited semiconductor channel material layer 161 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the as-deposited semiconductor channel material layer 161 includes amorphous silicon or polysilicon. The as-deposited semiconductor channel material layer 161 can be formed by a conformal deposition method such as low pressure chemical vapor deposition (LPCVD). The thickness of the as-deposited semiconductor channel material layer 161 can be in a range from 2 nm to 30 nm, although lesser and greater thicknesses can also be employed. A cavity 49' can be present in the volume of each memory opening 49 that is not filled with the memory film (502, 504, 506), the metallic material portion 13, and the as-deposited semiconductor channel material layer 161.

Figure 3H:
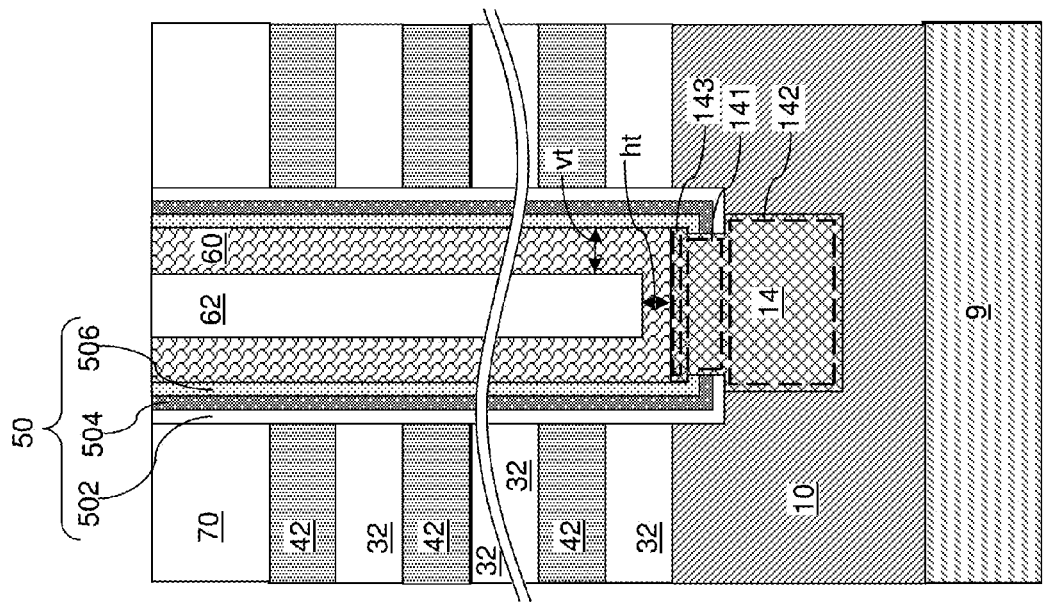
Figure 3G:
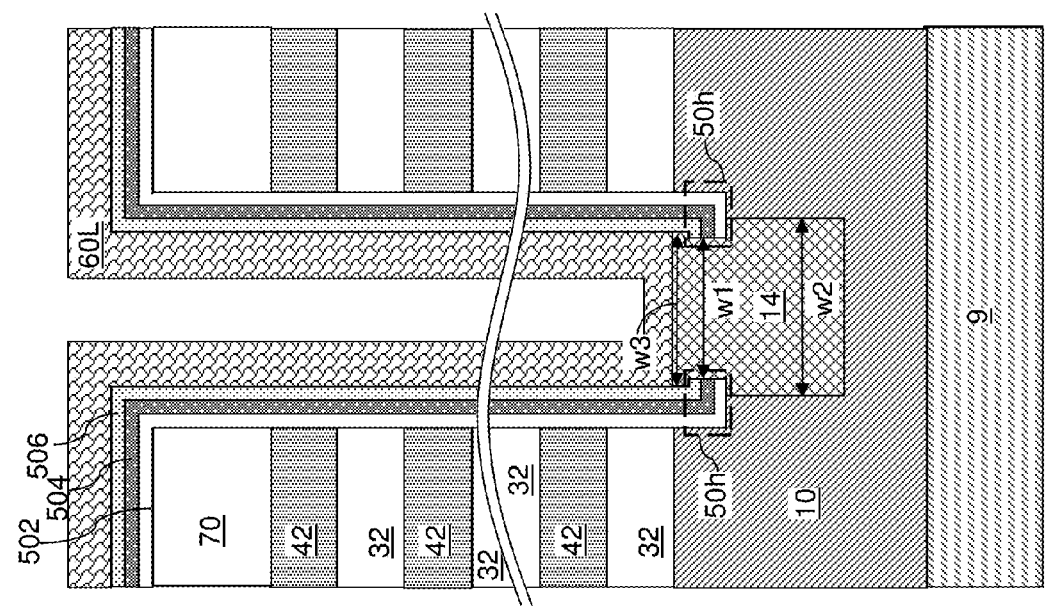

Referring to FIG. 3G, an anneal process can be performed at an elevated temperature to react the metallic material of the metallic material portion 13 with the semiconductor material of the semiconductor material layer 10 and with the semiconductor material of the as-deposited semiconductor channel material layer 161. A metal-semiconductor alloy region 14 is formed by the reaction of the metallic material and the semiconductor materials. The metal-semiconductor alloy region 14 comprises a metal-semiconductor alloy, which is an alloy of a metal such as tungsten, ruthenium, and/or cobalt and the semiconductor material of the semiconductor material layer 10 and the as-deposited semiconductor channel material layer 161. In one embodiment, the metal-semiconductor alloy region 14 comprises a metal silicide of at least one metal element in the metallic material portion 13. The as-deposited semiconductor channel material layer 161 is converted into an annealed semiconductor channel material layer 60L, which can be a polycrystalline semiconductor material layer. In one embodiment, the as-deposited semiconductor channel material layer 161 can be an amorphous silicon layer, and the metal-semiconductor alloy region 14 can be formed by a rapid thermal anneal which reacts the at least one metallic material with a portion of the semiconductor material of the substrate and with the amorphous silicon layer of the as-deposited semiconductor channel material layer 161 to form the metal-semiconductor alloy region 14, and which converts the amorphous silicon layer to a polysilicon semiconductor channel.

Referring to FIG. 3H, a dielectric material can be deposited in the cavity 49' to fill any remaining portion of the cavity 49' within each memory opening 49. The dielectric material can comprise, for example, silicon oxide or organosilicate glass. The dielectric material can be deposited by a conformal deposition method such as low pressure chemical vapor deposition (LPCVD), or by a self-planarizing deposition process such as spin coating.

Horizontal portion of the deposited dielectric material, the annealed semiconductor channel material layer 60L, and the memory film (502, 504, 506) can be removed, for example, by a recess etch and/or chemical mechanical planarization from above a horizontal plane including the top surface of the insulating cap layer 70. Each remaining portion of the deposited dielectric material, the annealed semiconductor channel material layer 60L, and the memory film (502, 504, 506) is spatially confined within the memory openings 49, and does not extend outside of the memory openings 49. Each remaining portion of the memory film 50 is located within a respective memory opening 49, and includes a remaining portion of the at least one blocking dielectric layer 502, a remaining portion of the memory material layer 504, and a remaining portion of the tunneling dielectric layer 506. Each remaining portion of the annealed semiconductor channel material layer 60L constitutes a vertical semiconductor channel 60, and is located within a respective memory film 50. Each remaining portion of the dielectric material constitutes a dielectric core 62, and is located within a respective vertical semiconductor channel 60.

In one embodiment, each vertical semiconductor channel 60 constitutes a portion of a semiconductor channel through which electrical current can flow when a vertical NAND device including the vertical semiconductor channel 60 is turned on. A tunneling dielectric layer 506 is embedded within the memory film 50, and laterally surrounds a portion of the vertical semiconductor channel 60. Each adjoining set of at least one blocking dielectric layer 502, a memory material layer 504, and a tunneling dielectric layer 506 collectively constitute a memory film 50, which can store electrical charges with a macroscopic retention time. As used herein, a macroscopic retention time refers to a retention time suitable for operation of a memory device as a permanent memory device such as a retention time in excess of 24 hours. The first memory stack structure comprises an adjoining set of a memory film and a vertical semiconductor channel 60 within a memory opening 49.

Referring collectively to FIGS. 3G and 3H, formation of the metal-semiconductor alloy region 14 consumes the metallic material of the metallic material portion 13 and the semiconductor material of the semiconductor material layer 10. Thus, the interface between the metal-semiconductor alloy region 14 and the semiconductor material layer 10 is shifted outward with respect to the interface between the metallic material portion 13 and the semiconductor material layer 10, which is vertically coincident with the sidewalls of the opening 49a in the horizontal portion 50h of the memory film (502, 504, 506). In one embodiment, a first portion 141 of the metal-semiconductor alloy region 14 can extend through an opening in the horizontal portion 50h of the memory film (502, 504, 506), and can have a first width w1. A second portion 142 of the metal-semiconductor alloy region 14 can be located below the bottom surface of the memory film (502, 504, 506), and can have a second width w2 such that the second width w2 is greater than the first width w1. A third portion 143 of the metal-semiconductor alloy region 14 located above the horizontal portion 50h of the memory film (502, 504, 506) can have a third width w3. In this case, the third width w3 is greater than the first width w1.

For example, when the metallic material portion comprises ruthenium, then the rapid thermal anneal may have a temperature between 750 and 950° C. with an optional spike above 950° C., such as to 1000 to 1100° C., for any suitable duration, such as 1 second to 30 minutes, for example, 30 seconds to 1 minute. Ruthenium reacts with surrounding silicon and forms ruthenium silicide (e.g., $Ru_2Si_3$) which expands horizontally and vertically to increase the lateral and vertical dimensions of the silicide region 14 compared to those of the ruthenium layer 13. The lateral expansion of the silicide region 14 moves its vertical interface 14a with layer 10 (or with the substrate semiconductor layer 9 if layer 10 is omitted) into the bulk semiconductor region which results in a better interface quality. Thus, as shown in FIG. 3G, the vertical interface 14a between the semiconductor material of the substrate (e.g., layer 9 or 10) and the metal-semiconductor alloy region 14 is laterally offset from a sidewall of the opening 49a (shown in FIG. 3D) through a horizontal portion 50h of the memory film 50. The metal-semiconductor alloy region 14 is at least partially embedded within semiconductor material of the substrate (e.g., in layer 9 or 10). For example, the lower portion of region 14 is embedded in layer 10, which the upper portion of region 14 extends above layer 10 into opening 49a or above portion 50h, as shown in FIG. 3G.

Further, formation of the metal-semiconductor alloy region 14 consumes the metallic material of the metallic material portion 13 and the semiconductor material of the as-deposited semiconductor channel material layer 161. Thus, the interface between the metal-semiconductor alloy region 14 and the annealed semiconductor channel material layer 161 is shifted upward with respect to the interface between the metallic material portion 13 and the as-deposited semiconductor channel material layer 161 due to consumption of the semiconductor material of the as-deposited semiconductor channel material layer 161 during the anneal.

In one embodiment, the periphery of the interface between the metal-semiconductor alloy region 14 and the vertical semiconductor channel 60 can be located above the horizontal portion 50h of the memory film 50, and can contact the sidewall of the memory film 50. Alternatively, the periphery of the interface between the metal-semiconductor alloy region 14 and the vertical semiconductor channel 60 can contact a sidewall of the opening in the horizontal portion 50h of the memory film 50. In one embodiment, the sidewall of the vertical semiconductor channel 60 can have a first thickness, which is herein referred to as a vertical thickness vt, and a horizontal portion of the vertical semiconductor channel 60 can have a second thickness, which is herein referred to as a horizontal thickness ht. The horizontal thickness ht can be less than the vertical thickness vt due to consumption of the semiconductor material of the as-deposited semiconductor channel material layer 161 during formation of the metal-semiconductor alloy region 14.

Figure 3J:
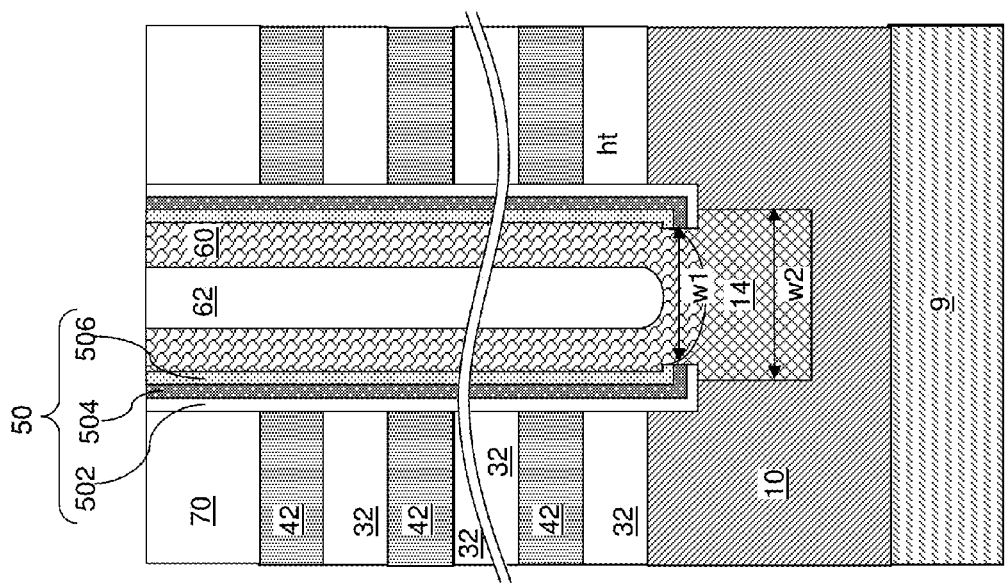
FIG. 3J is a vertical cross-sectional view of a second alternative embodiment of the first exemplary memory stack structure.
Figure 3I:
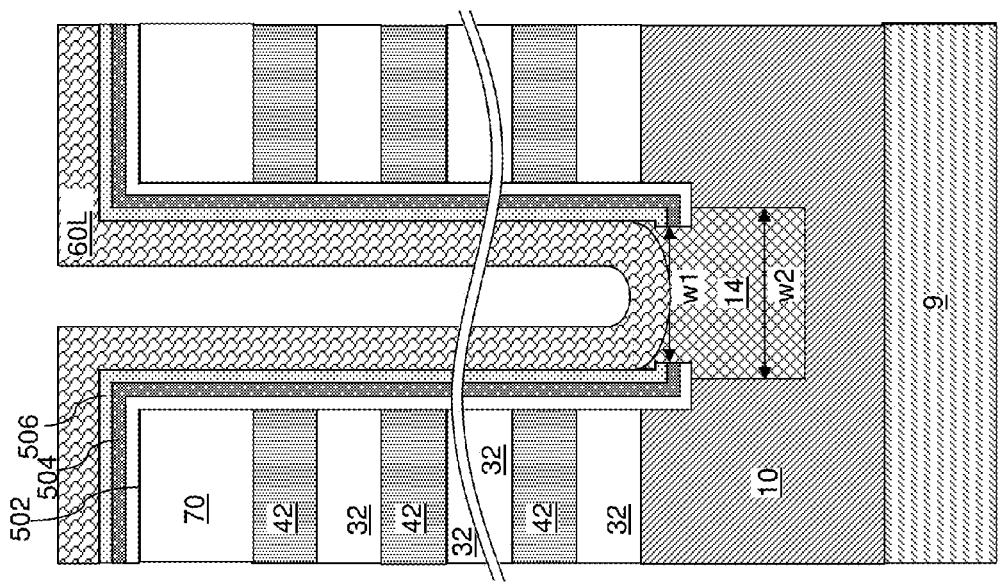
FIG. 3I is a vertical cross-sectional view of a first alternative embodiment of the first exemplary memory stack structure.

Referring to FIG. 3I, a first alternative embodiment of the first exemplary memory stack structure can be derived from the structure of FIG. 3E by selecting a thinner thickness for the metallic material portion 13 and/or a thinner thickness for the as-deposited semiconductor channel material layer 161. In this case, the annealed semiconductor channel material layer 60L can have a convex bottom surface and a concave top surface at a bottom portion contacting the metal-semiconductor alloy region 14 after the processing steps of FIG. 3G.

Referring to FIG. 3J, the processing steps of FIG. 3H can be performed on the structure of FIG. 3I to form a vertical semiconductor channel 60, a memory film 50, and a dielectric core 62 within each memory opening 49.

Figures 4A, 4B:
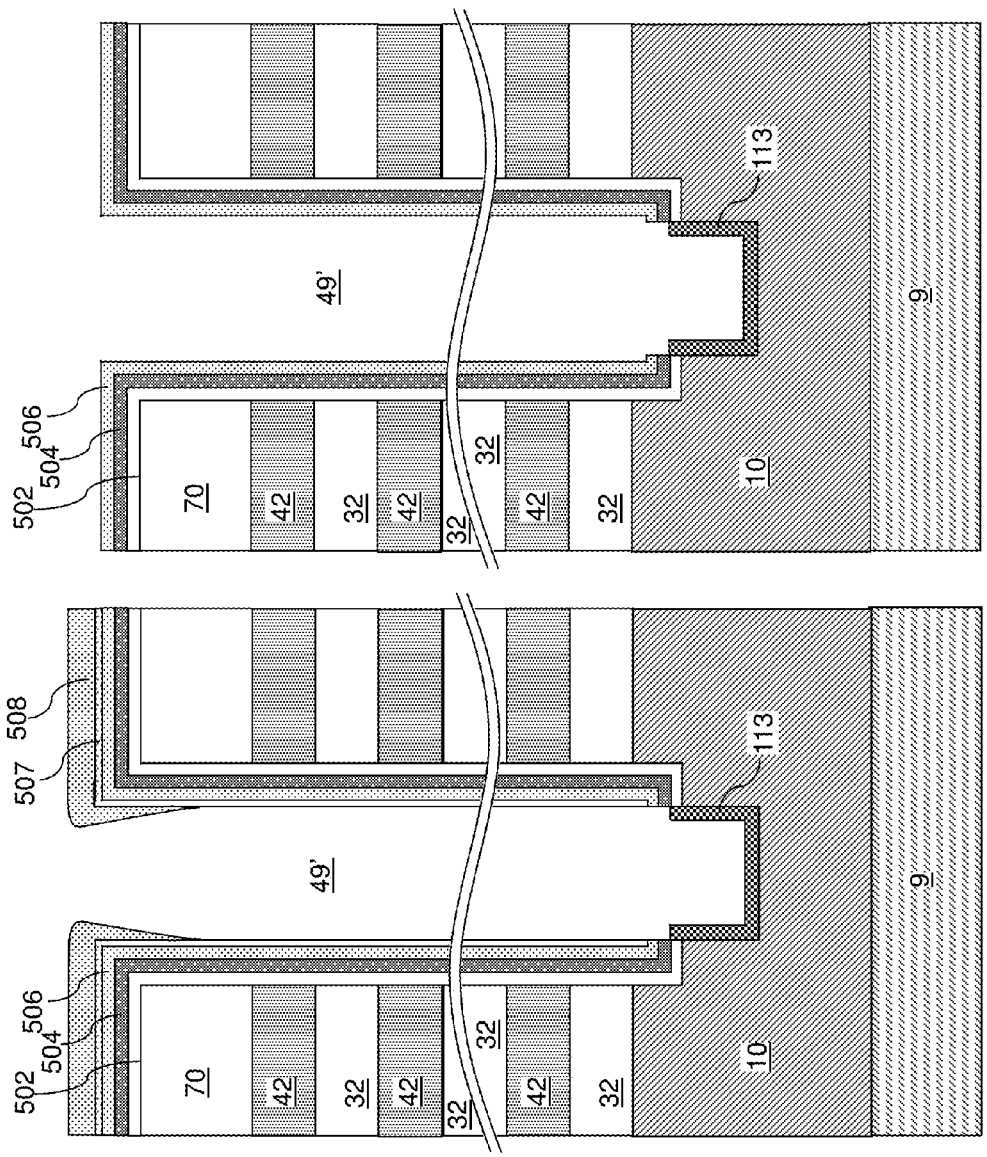

Referring to FIG. 4A, a second memory stack structure according to a second embodiment of the present disclosure can be derived from the structure of FIG. 3C by omitting the processing steps of FIG. 3D and by performing the processing steps of FIG. 3E. At least one of the sacrificial dielectric material layer 507 and the sacrificial non-conformal material layer 508 is present at the time of deposition of a metallic material at the processing steps corresponding to the processing steps of FIG. 3E. This embodiment is advantageous because the deposition of the metallic material may produce harmful byproducts that would attack the exposed tunnel dielectric layer, if the deposition happened after the layers 507 and 508 were removed. For example, if the metallic material comprises tungsten deposited using $WF_6$ and $H_2$ source gases, then one of the byproducts of the reaction is HF which can easily etch the exposed tunnel dielectric layer. However if the sacrificial layers (e.g., at least layer 507) is present during deposition of the metallic material, the undesired etching of the tunnel dielectric layer is avoided. Furthermore, by retaining the sacrificial layer(s) 507 and 508, fluorine containing CVD source gases which generate HF as a by-product during deposition may be used to deposit the metallic material. The sacrificial layer(s) 507 and 508 may be removed after deposition of the metallic material.

A first metallic material portion 113 can be formed by a selective deposition process on the sidewalls and a horizontal surface of the semiconductor material layer in the recess region 59 (which is illustrated in FIG. 3C), and is not deposited over the stack of alternating layers (32, 42). The first metallic material portion 113 can include the same material as the metallic material portion 13 of the first embodiment (such as tungsten or cobalt) which can be selectively deposited on silicon versus the material (e.g., carbon) of the sacrificial layer(s) 507, 508, and can be formed by a same deposition method. In this case, the sacrificial dielectric material layer 507 and/or the sacrificial non-conformal material layer 508 includes a dielectric material, and the metallic material does not grow from the surfaces of the sacrificial dielectric material layer 507 and/or the sacrificial non-conformal material layer 508.

The thickness of the deposited metallic material for the first metallic material portion 113 can be less than the thickness of the metallic material portion 13 of the first embodiment. In one embodiment, the thickness of the first metallic material portion 13, as measured on the sidewalls and the bottom surface of the recess region 59, can be in a range from 1 nm to 10 nm (for example, from 2 nm to 5 nm), although lesser and greater thicknesses can also be employed.

Referring to FIG. 4B, the sacrificial dielectric material layer 507 and/or the sacrificial non-conformal material layer 508 can be removed selective to the memory film (502, 504, 506) and the first metallic material portion 113, for example, by ashing.

Referring to FIG. 4C, a second metallic material portion 213 can be formed by another selective deposition process on the surfaces of the first metallic material portion 113, and is not deposited over the stack of alternating layers (32, 42). The second metallic material portion 213 can include any material that can be employed as the metallic material portion 13 of the first embodiment (such as tungsten, ruthenium, or cobalt), and can be formed by a same deposition method. Preferably the first metallic material portion 113 contains a different metallic material (e.g., tungsten) than the second metallic material portion 213 (e.g., ruthenium). The metallic material does not grow from the surfaces of the tunneling dielectric layer 506. In case the at least one blocking dielectric layer 502 and the memory material layer 504 includes a dielectric material, the metallic material does not grow from surfaces of the memory film (502, 504, 506). In this case, the selectively deposited metallic materials can comprises layered stack of at least two metallic material portions having different compositions.

The thickness of the deposited metallic material for the second metallic material portion 213 can be less than the thickness of the metallic material portion 13 of the first embodiment. In one embodiment, the thickness of the second metallic material portion 213, as measured on the sidewalls and the bottom surface of the first metallic material portion 113, can be in a range from 1 nm to 15 nm (for example, from 2 nm to 10 nm), although lesser and greater thicknesses can also be employed. The combined thicknesses of the first and second metallic material portions (113, 213) can be in a range from 2 nm to 20 nm (for example, from 4 nm to 10 nm), although lesser and greater thicknesses can also be employed.

Referring to FIG. 4D, the processing steps of FIG. 3F are performed to form an as-deposited semiconductor channel material layer 161 in the same manner as in the first embodiment.

Figure 4F:
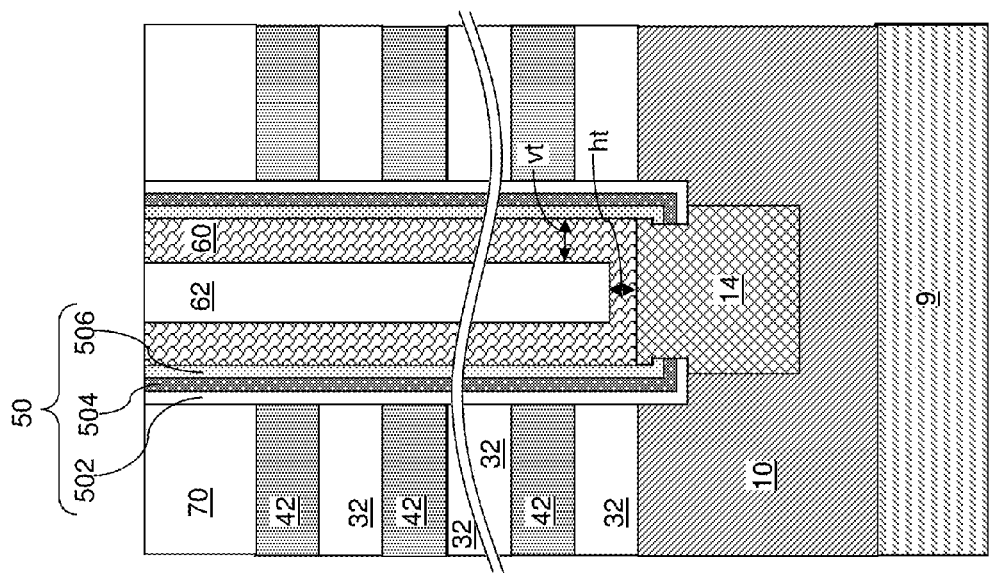
Figure 4E:
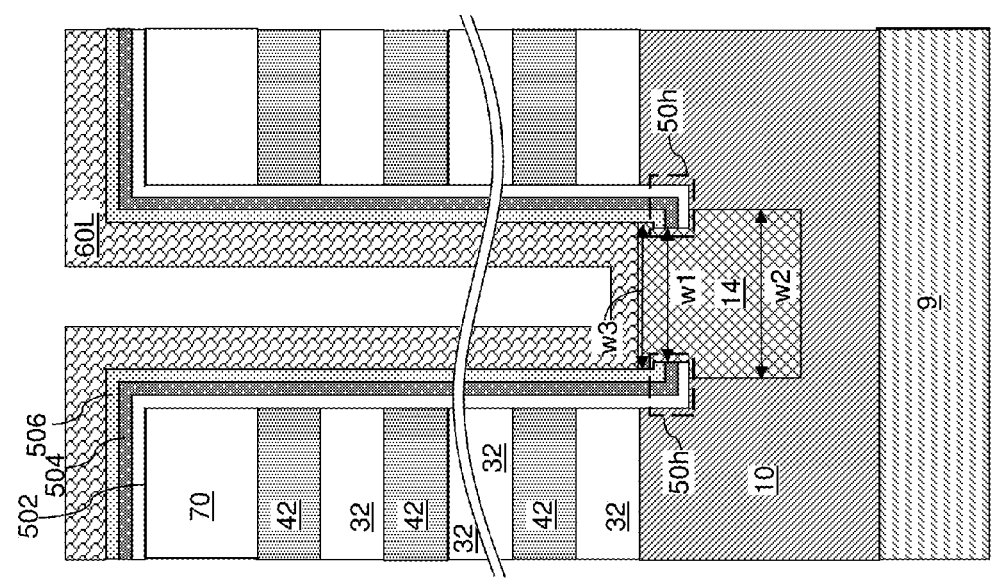

Referring to FIG. 4E, the processing steps of FIG. 3G are performed to form a metal-semiconductor alloy region 14 and the annealed semiconductor channel material layer 60L in the same manner as in the first embodiment. The metal-semiconductor alloy region 14 can comprise a metal silicide of two or more metal elements.

Formation of the metal-semiconductor alloy region 14 consumes the metallic material of the metallic material portions (113, 213) and the semiconductor material of the semiconductor material layer 10. Thus, the interface between the metal-semiconductor alloy region 14 and the semiconductor material layer 10 is shifted outward with respect to the interface between the first metallic material portion 113 and the semiconductor material layer 10, which is vertically coincident with the sidewalls of the openings in the horizontal portion 50h of the memory film (502, 504, 506). In one embodiment, a first portion of the metal-semiconductor alloy region 14 can extend through an opening in the horizontal portion 50h of the memory film (502, 504, 506), and can have a first width w1. A second portion of the metal-semiconductor alloy region 14 can be located below the bottom surface of the memory film (502, 504, 506), and can have a second width w2 such that the second width w2 is greater than the first width w1. A third portion of the metal-semiconductor alloy region 14 located above the horizontal portion 50h of the memory film (502, 504, 506) can have a third width w3. In this case, the third width w3 is greater than the first width w1.

Further, formation of the metal-semiconductor alloy region 14 consumes the metallic material of the metallic material portions (113, 213) and the semiconductor material of the as-deposited semiconductor channel material layer 161. Thus, the interface between the metal-semiconductor alloy region 14 and the annealed semiconductor channel material layer 161 is shifted upward with respect to the interface between the second metallic material portion 213 and the as-deposited semiconductor channel material layer 161 due to consumption of the semiconductor material of the as-deposited semiconductor channel material layer 161 during the anneal.

Referring to FIG. 4F, the processing steps of FIG. 3H can be performed to form a memory stack structure including a memory film 50 and a vertical semiconductor channel 60. A dielectric core 62 can be formed inside the vertical semiconductor channel 60. In one embodiment, the periphery of the interface between the metal-semiconductor alloy region 14 and the vertical semiconductor channel 60 can be located above the horizontal portion 50h of the memory film 50, and can contact the sidewall of the memory film 50. Alternatively, the periphery of the interface between the metal-semiconductor alloy region 14 and the vertical semiconductor channel 60 can be below or can contact a sidewall of the opening in the horizontal portion 50h of the memory film 50. In one embodiment, the sidewall of the vertical semiconductor channel 60 can have a first thickness, which is herein referred to as a vertical thickness vt, and a horizontal portion of the vertical semiconductor channel 60 can have a second thickness, which is herein referred to as a horizontal thickness ht. The horizontal thickness ht can be less than the vertical thickness vt due to consumption of the semiconductor material of the as-deposited semiconductor channel material layer 161 during formation of the metal-semiconductor alloy region 14. The vertical semiconductor channel 60 can be formed by a single deposition process, followed by an anneal.

Figures 5A, 5B:
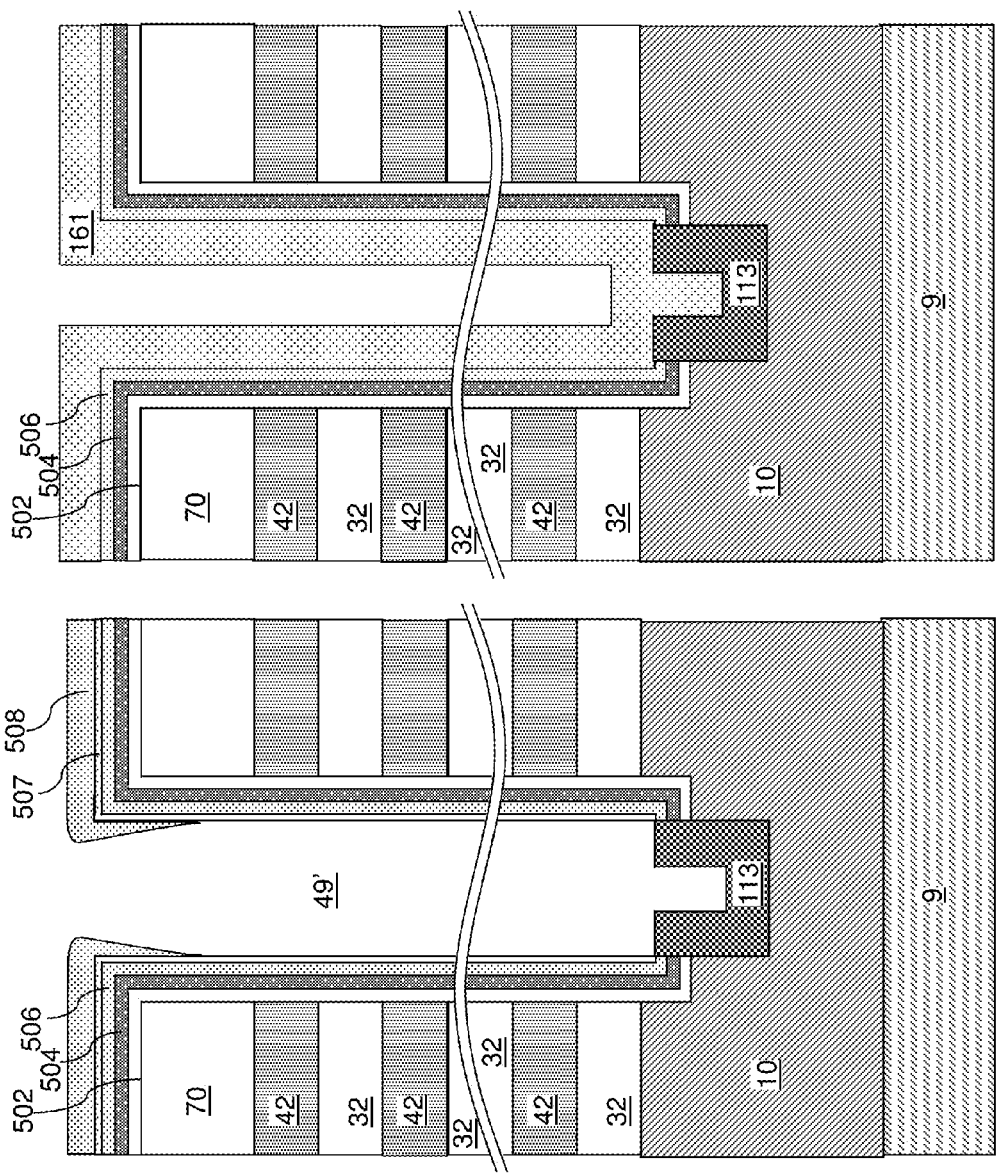
FIGS. 5A and 5B are sequential vertical cross-sectional views of a memory opening within the exemplary structure during various processing steps employed to form a third exemplary memory stack structure according to a third embodiment of the present disclosure.

Referring to FIG. 5A, a third exemplary memory stack structure can be derived from the exemplary structure of FIG. 4A by increasing the thickness of the first metallic material portion 113 such that thickness of the first metallic material portion 113 is comparable to the thickness of the metallic material portion 13 of the first embodiment. In one embodiment, the thickness of the first metallic material portion 113 can be in a range from 2 nm to 20 nm (for example, from 4 nm to 10 nm), although lesser and greater thicknesses can also be employed.

Referring to FIG. 5B, the processing steps of FIG. 4B can be performed to remove the sacrificial dielectric material layer 507 and/or the sacrificial non-conformal material layer 508. The processing steps of FIG. 4C are omitted, and the processing steps of FIG. 4D can be performed to form the as-deposited semiconductor material layer 161 directly on the physically exposed surfaces of the first metallic material portion 113.

Subsequently, the processing steps of FIGS. 3G and 3H can be performed to form a same structure as the first exemplary memory stack structure illustrated in FIG. 3H.

In an alternative embodiment, the conversion of the metallic material portion (13, 113, 213) to the alloy portion 14 may take place before the deposition of the semiconductor channel material layer 161. In this embodiment, the anneal (e.g., rapid thermal anneal) is performed prior to deposition of layer 161 and the anneal reacts the metallic material portion (13, 113, 213) only with the semiconductor material of the substrate (e.g., with layer 9 or 10) to form the alloy portion 14. The semiconductor channel material layer 161 is then deposited on the alloy portion 14.

In this alternative embodiment, the metallic material portion (13, 113, 213) may comprise one or more metal layers, such as titanium, cobalt, molybdenum, cobalt, nickel, ruthenium, tungsten, platinum, etc. layer which is deposited non-selectively into the opening 49' on the sacrificial dielectric layer 507 and through opening 49a on the exposed semiconductor material portion of the substrate (e.g., on exposed portion of layer 10 in the recess 59). The metal layer is then annealed to react it with the semiconductor material to form the alloy portion (e.g., metal silicide) 14 where the metal layer contacted the semiconductor material (e.g., silicon). The remaining unreacted portion of the metal layer located on the on the sacrificial dielectric layer 507 is removed by selective etching which does not remove the alloy portion 14.

In this embodiment, the sacrificial non-conformal material layer 508 may be removed prior to deposition of the metal layer. Alternatively, the metal layer may be deposited over layer 508. Layer 508 may then be removed after formation of the silicide region 14 (e.g., by a lift off process to also lift off the remaining unreacted metal layer portion or by ashing after removing the remaining unreacted metal layer portion by selective etching).

Figure 6:
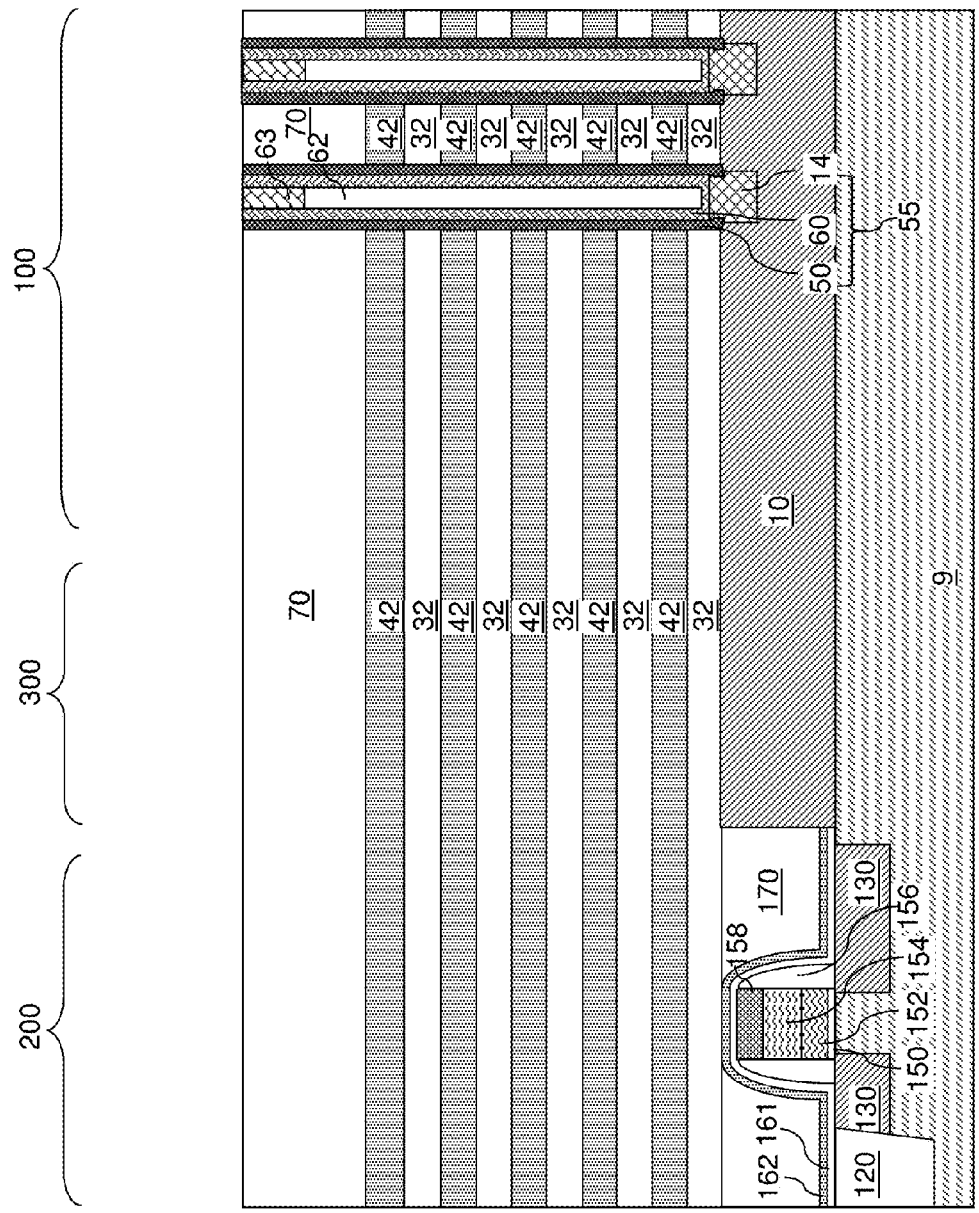
FIG. 6 is a vertical cross-sectional view of the exemplary structure after formation of memory stack structures according to an embodiment of the present disclosure.

Referring to FIG. 6, the memory stack structures formed in the memory openings 49 of the exemplary structure of FIG. 2 can be any of the first, second, and third exemplary memory stack structures or alternative embodiments thereof. Drain regions 63 can be formed by vertically recessing a top surface of the dielectric cores 62 by an anisotropic etch, and by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63. Within each memory opening, a lateral stack is formed, which includes, from outside to inside, a memory film 50 and a vertical semiconductor channel 60.

The exemplary structure includes a semiconductor device, which comprises a stack (32, 42) including an alternating plurality of material layers (e.g., the spacer material layers 42) and insulator layers 32 located over a semiconductor substrate (9, 10), and a memory opening extending through the stack (32, 42). The semiconductor device further comprises at least one blocking dielectric layer 502 vertically extending from a top surface of the insulating cap layer 70 and at least to the top surface of the semiconductor substrate (9, 10).

Figure 7:
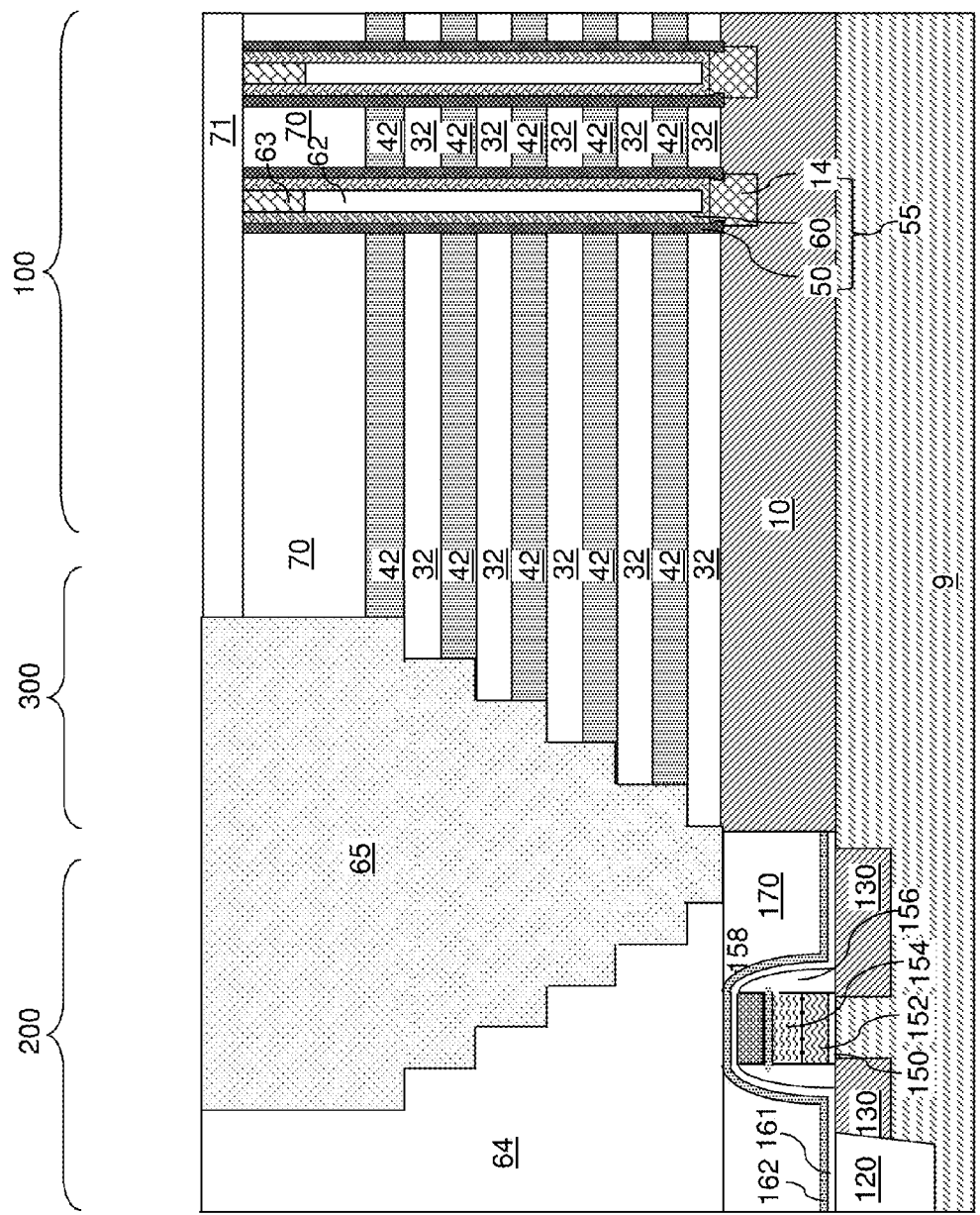
FIG. 7 is a vertical cross-sectional view of the exemplary structure after formation of a stepped terrace and a retro-stepped dielectric material portion according to an embodiment of the present disclosure.

Referring to FIG. 7, at least one dielectric cap layer 71 can be optionally formed over the planarization dielectric layer 70. The at least one dielectric cap layer 71 can include a dielectric material that can be employed as a stopping layer in a subsequent planarization process. In one embodiment, the at least one dielectric cap layer 71 can include a dielectric metal oxide, silicon nitride, a nitrogen-containing organosilicate glass, silicon oxynitride, and/or silicon oxide. The thickness of the at least one dielectric cap layer 71 can be in a range from 10 nm to 300 nm, although lesser and greater thicknesses can also be employed.

Optionally, a portion of the alternating stack (32, 42) can be removed, for example, by applying and patterning a photoresist layer with an opening and by transferring the pattern of the opening through the alternating stack (32, 42) employing an etch such as an anisotropic etch. An optional trench extending through the entire thickness of the alternating stack (32, 42) can be formed within an area that includes the peripheral device region 200 and a portion of a contact region 300, which is adjacent to the device region 100 that includes an array of memory stack structures 55. Subsequently, the trench can be filled with an optional dielectric material such as silicon oxide. Excess portions of the dielectric material can be removed from above the top surface of the at least one dielectric cap layer 71 by a planarization process such as chemical mechanical planarization and/or a recess etch. The top surfaces of the at least one dielectric cap layer 71 can be employed as a stopping surface during the planarization. The remaining dielectric material in the trench constitutes a dielectric material portion 64.

A stepped cavity can be formed within the contact region 300, which can straddle the dielectric material portion 64 and a portion of the alternating stack (32, 42). Alternatively, the dielectric material portion 64 may be omitted and the stepped cavity 69 may be formed directly in the stack (32, 42). The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

The dielectric material portion 64 can have stepped surfaces after formation of the stepped cavity, and a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the at least one dielectric cap layer 71, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 8A:
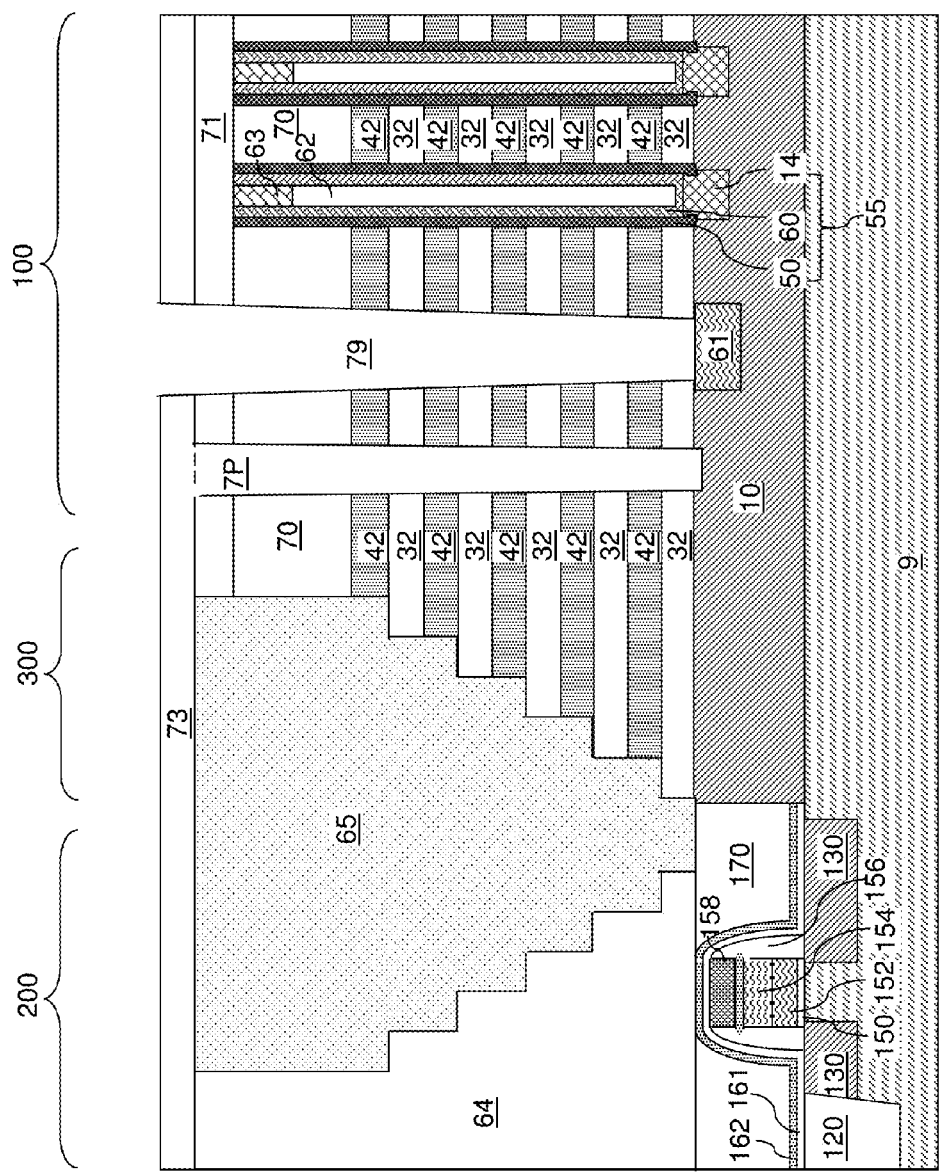
FIG. 8A is a vertical cross-sectional view of the exemplary structure after formation of a backside via cavity and backside recesses according to an embodiment of the present disclosure.
Figure 8B:
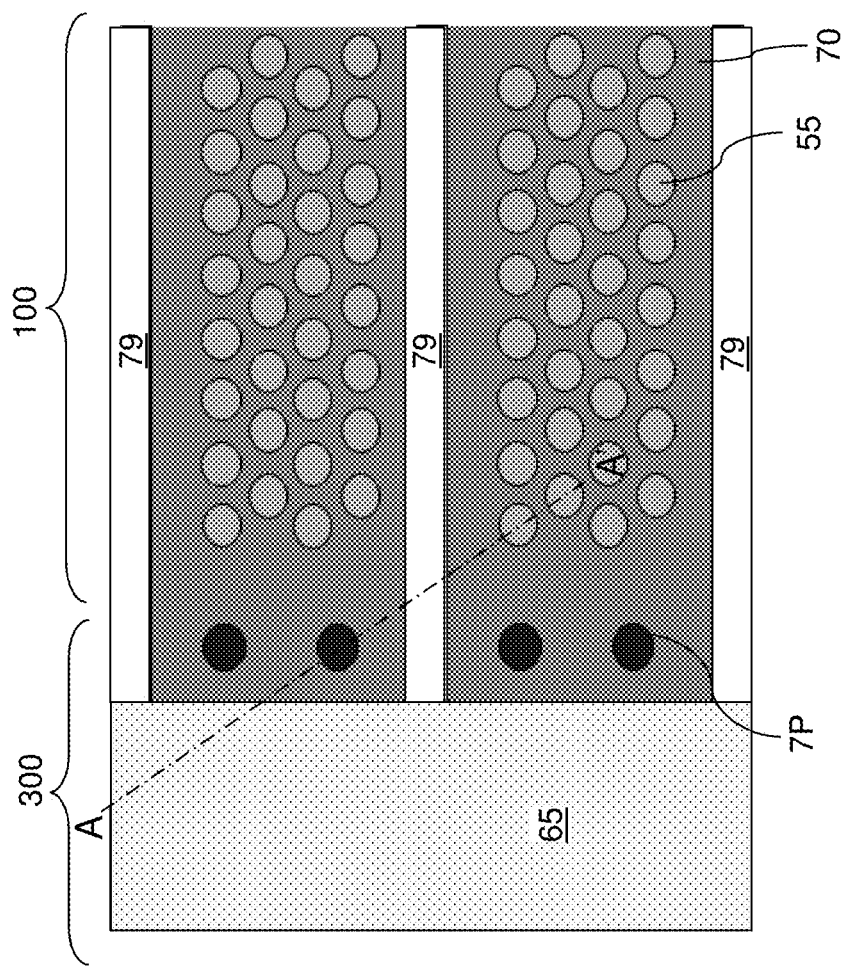
FIG. 8B is a see-through top-down view of the exemplary structure of FIG. 8A. The vertical plane A-A' is the plane of the vertical cross-sectional view of FIG. 8A.
Figure 9:
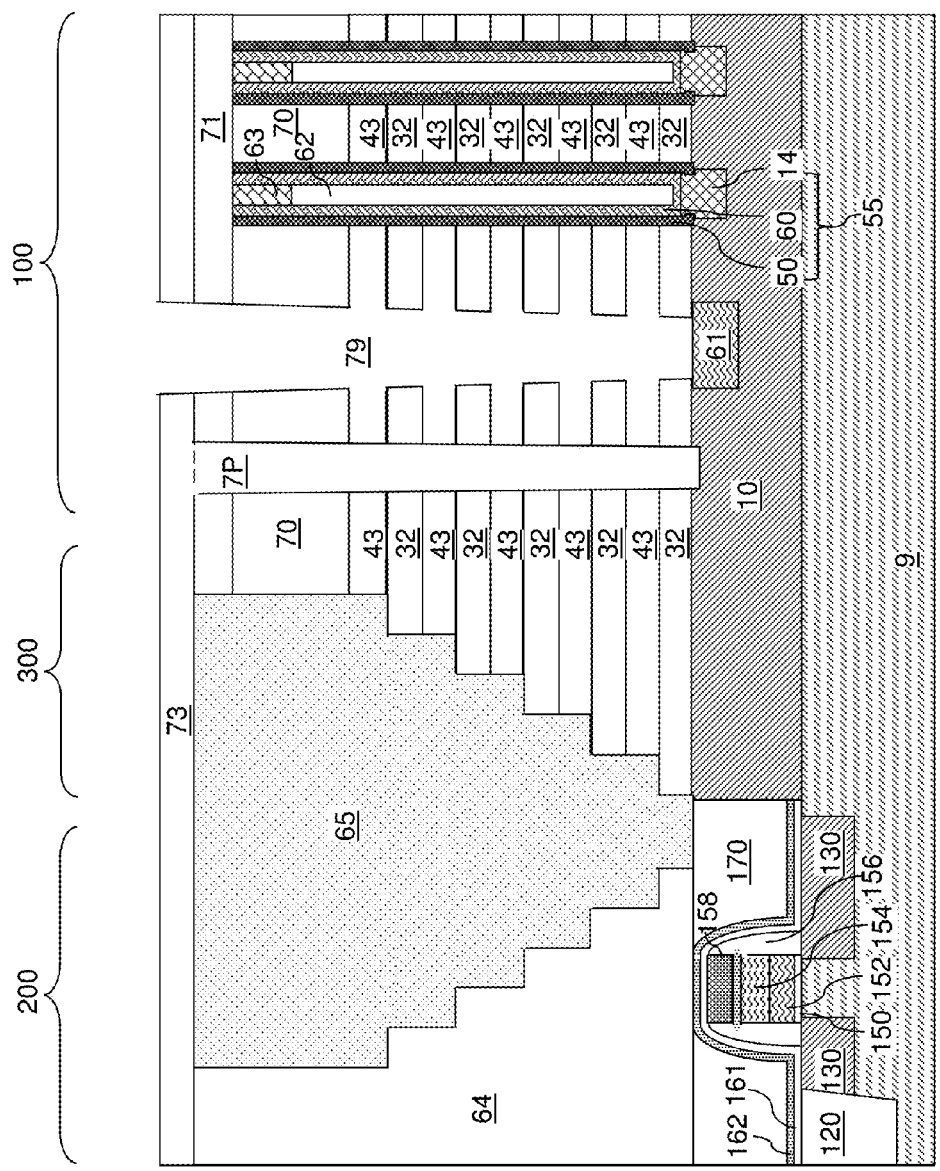
FIG. 9 is a vertical cross-sectional view of the exemplary structure after formation of backside recesses according to an embodiment of the present disclosure.

Referring to FIGS. 8A and 8B, at least one dielectric support pillar 7P may be optionally formed through the retro-stepped dielectric material portion 65 and/or through the alternating stack (32, 42). The plane A-A' in FIG. 8B corresponds to the plane of the vertical cross-sectional view of FIG. 8A. In one embodiment, the at least one dielectric support pillar 7P can be formed in the contact region 300, which is located adjacent to the device region 100. The at least one dielectric support pillar 7P can be formed, for example, by forming an opening extending through the retro-stepped dielectric material portion 65 and/or through the alternating stack (32, 42) and at least to the top surface of the substrate (9, 10), and by filling the opening with a dielectric material that is resistant to the etch chemistry to be employed to remove the spacer material layers 42.

In one embodiment, the at least one dielectric support pillar can include silicon oxide and/or a dielectric metal oxide such as aluminum oxide. In one embodiment, the portion of the dielectric material that is deposited over the at least one dielectric cap layer 71 concurrently with deposition of the at least one dielectric support pillar 7P can be present over the at least one dielectric cap layer 71 as a dielectric pillar material layer 73. The dielectric pillar material layer 73 and the at least one dielectric support pillar 7P can be formed as a single contiguous structure of integral construction, i.e., without any material interface therebetween. In another embodiment, the portion of the dielectric material that is deposited over the at least one dielectric cap layer 71 concurrently with deposition of the at least one dielectric support pillar 7P can be removed, for example, by chemical mechanical planarization or a recess etch. In this case, the dielectric pillar material layer 73 is not present, and the top surface of the at least one dielectric cap layer 71 can be physically exposed.

A photoresist layer (not shown) can be applied over the alternating stack (32, 42) and/or the retro-stepped dielectric material portion 65, and optionally over the and lithographically patterned to form at least one backside contact trench 79 in an area in which formation of a backside contact via structure is desired. The pattern in the photoresist layer can be transferred through the alternating stack (32, 42) and/or the retro-stepped dielectric material portion 65 employing an anisotropic etch to form the at least one backside contact trench 79, which extends at least to the top surface of the substrate (9, 10). In one embodiment, the at least one backside contact trench 79 can include a source contact opening in which a source contact via structure can be subsequently formed.

If desired, a source region (not shown) may be formed by implantation of dopant atoms into a portion of the semiconductor material layer 10 through the backside contact trench 79.

In one embodiment, the at least one backside contact trench 79 can be formed through the alternating stack (32, 42) by an anisotropic etch process. In one embodiment, the etch chemistry can employ a hydrofluorocarbon based etchant gas or a hydrochlorocarbon based etchant gas.

A source region 61 can be formed in each surface portion of the semiconductor material layer 10 that underlies the at least one backside contact trench 79. Each source region 61 can be formed by implanting electrical dopants of the same conductivity type as the doping type of the drain regions 63. In one embodiment, each source region 61 can be formed by ion implantation and/or plasma doping. In one embodiment, at least the portion of the semiconductor material layer 10 underlying the memory stack structures 55 and the at least one backside contact trench 79 can have a doping of a first conductivity type (which can be p-type or n-type), and the at least one source region 61 and the drain regions 63 can have a doping of a second conductivity type that is the opposite of the first conductivity type. The vertical semiconductor channels 60 can have a doping of the first conductivity type, or can be intrinsic. Alternatively, if layer 10 comprises a doped source line (e.g., an n-doped well), then region 61 may be omitted or it may comprise a source electrode contact region (e.g., an n+ contact region in layer 10).

In one embodiment, the spacer material layers 42 can be sacrificial material layers that can be removed selective to the first material of the insulator layers 32. For example, the spacer material layers 42 can comprise silicon nitride that can be removed selective to the insulator layers 32 (which can comprise silicon oxide). An etchant that selectively etches the second material of the spacer material layers 42 with respect to the first material of the insulator layers 32 can be introduced into the at least one backside contact trench 79, for example, employing an etch process. Backside recesses 43 are formed in volumes from which the spacer material layers 42 are removed. The removal of the second material of the spacer material layers 42 can be selective to the first material of the insulator layers 32, the material of the at least one dielectric support pillar 7P, the material of the retro-stepped dielectric material portion 65, the semiconductor material of the semiconductor material layer 10, and the material of the outermost layer of the memory films 50. In one embodiment, the spacer material layers 42 can include silicon nitride, and the materials of the insulator layers 32, the at least one dielectric support pillar 7P, and the retro-stepped dielectric material portion 65 can be selected from silicon oxide and dielectric metal oxides. In another embodiment, the spacer material layers 42 can include a semiconductor material such as polysilicon, and the materials of the insulator layers 32, the at least one dielectric support pillar 7P, and the retro-stepped dielectric material portion 65 can be selected from silicon oxide, silicon nitride, and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside contact trench 79. For example, if the spacer material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses 43 are present within volumes previously occupied by the spacer material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the spacer material layers 42 is removed. The memory openings in which the memory stack structures 55 are formed are herein referred to as front side recesses or front side cavities in contrast with the backside recesses 43. In one embodiment, the device region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulator layer 32 and a bottom surface of an overlying insulator layer 32. In one embodiment, each backside recess 43 can have a uniform height throughout.

Optionally, a backside blocking dielectric layer (not shown) can be formed on the physically exposed surface portions of the memory film 50 and surfaces of the insulator layers 32, the insulating cap layer 70, the dielectric cap layer 71, and the optional dielectric pillar material layer 73. As used herein, a "backside" blocking dielectric layer refers to a blocking dielectric layer located outside, or at a peripheral portion of, a memory opening. The backside blocking dielectric layer can comprise a material that is different from, or the same as, the material of the at least one blocking dielectric layer 502 (See FIG. 3B). For example, the backside blocking dielectric layer can comprise a dielectric metal oxide (such as aluminum oxide), and the at least one blocking dielectric layer 502 can comprise silicon oxide. The optional backside blocking dielectric layer can function, in conjunction with the at least one blocking dielectric layer 502, as an additional dielectric material layer that blocks leakage of stored electrical charges to control gate electrodes. In one embodiment, the backside blocking dielectric layer includes aluminum oxide. Alternatively, the at least one blocking dielectric layer 502 may be omitted, and a backside blocking dielectric layer may be the only dielectric material between charge storage elements and control gate electrodes.

Figure 10:
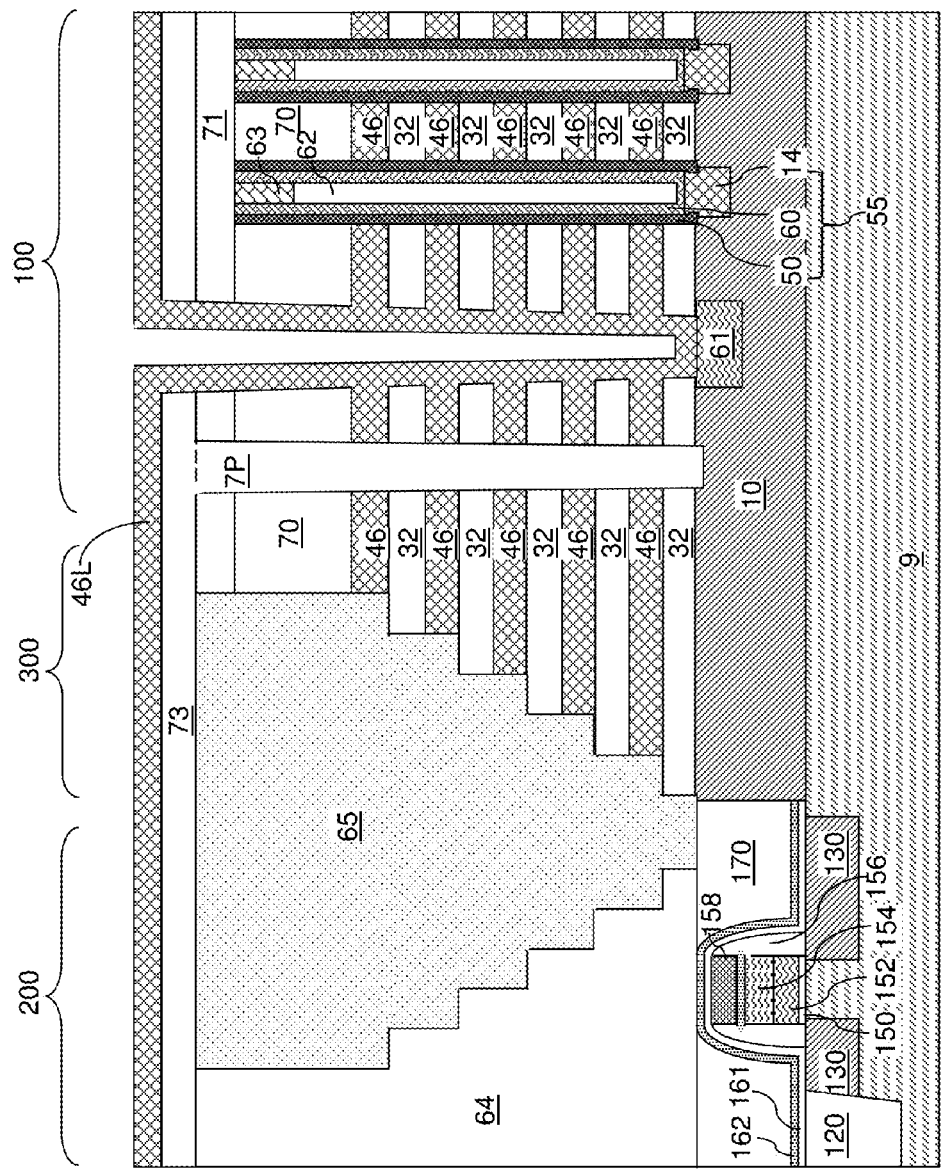
FIG. 10 is a vertical cross-sectional view of the exemplary structure after formation of the electrically conductive lines according to an embodiment of the present disclosure.

Referring to FIG. 10, at least one conductive material can be deposited in the plurality of backside recesses 43, on sidewalls of the at least one the backside contact trench 79, and over the top surface of the dielectric pillar material layer 73 (or the topmost layer of the exemplary structure in case the dielectric pillar material layer 73 is not employed). As used herein, a conductive material refers to an electrically conductive material. Each conductive material can be deposited by a conformal deposition method, which can be, for example, chemical vapor deposition (CVD), atomic layer deposition (ALD), electroless plating, electroplating, or a combination thereof. Each conductive material can be a metal element, an intermetallic alloy of at least two metal elements, a conductive nitride of at least one metal element, a conductive metal oxide, a conductive doped semiconductor material, a conductive metal-semiconductor alloy such as a metal silicide, alloys thereof, and combinations or stacks thereof. Non-limiting exemplary conductive materials that can be deposited in the plurality of backside recesses 43 include tungsten, tungsten nitride, titanium, titanium nitride, tantalum, and tantalum nitride. The at least one conductive material is deposited directly on horizontal surfaces of the insulator layers 32 and on the outer sidewalls of the at least one blocking dielectric layer 502.

In one embodiment, the at least one conductive material can comprise a metal such as tungsten and/or metal nitride. In one embodiment, the at least one conductive material for filling the plurality of backside recesses 43 can be selected from tungsten and a combination of titanium nitride and tungsten. In one embodiment, the at least one conductive material can be deposited by chemical vapor deposition. In one embodiment, the at least one conductive material can include a first conductive material comprising a conductive metallic compound and a metallic material comprising a metal element or an alloy of at least two metal elements.

Figure 11:
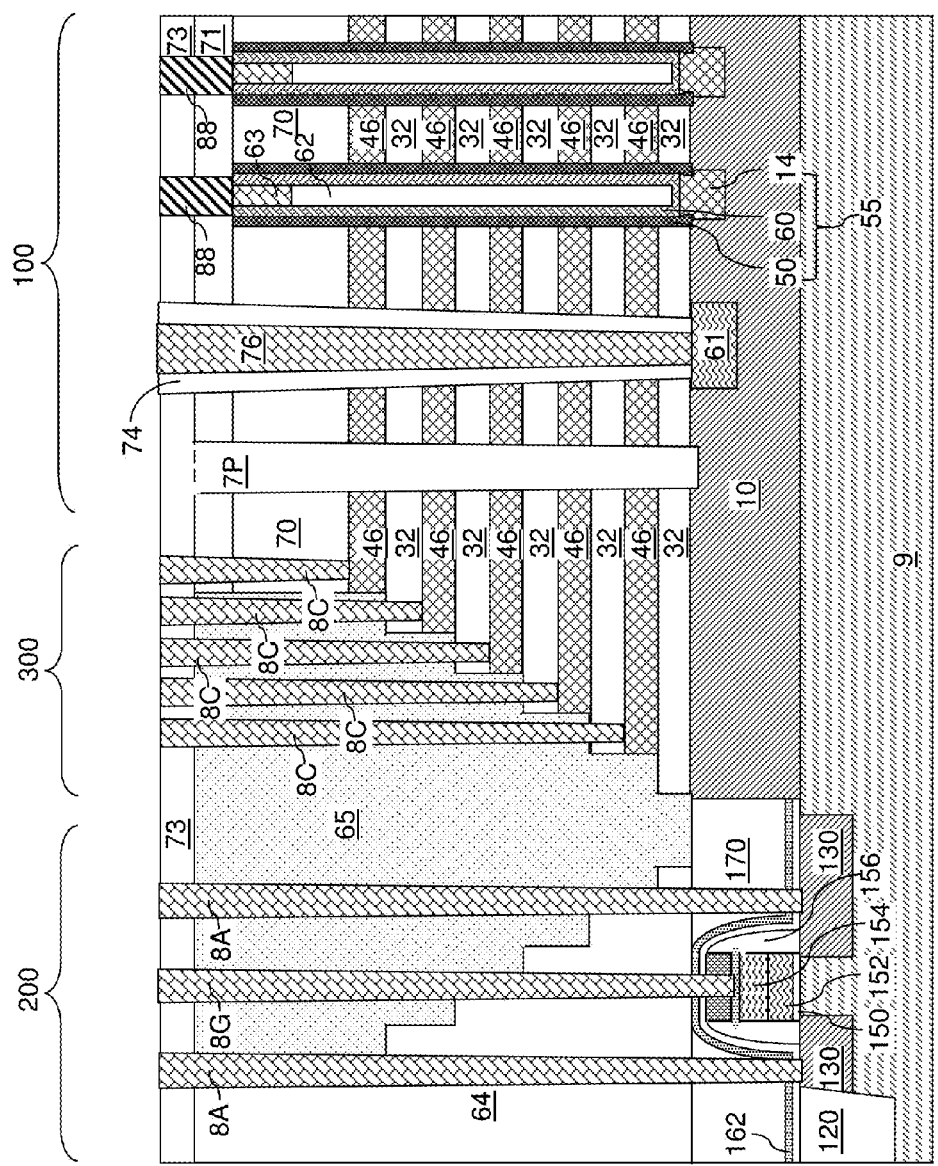
FIG. 11 is a vertical cross-sectional view of the exemplary structure after formation of a backside insulator spacer and a backside contact via structure according to an embodiment of the present disclosure.

Referring to FIG. 11, the deposited conductive material of the contiguous conductive material layer 46L is etched back from the sidewalls of each backside contact trench 79 and from above the dielectric pillar material layer 73 (or the topmost layer of the exemplary structure in case the dielectric pillar material layer 73 is not employed), for example, by an isotropic etch. Each remaining portion of the deposited conductive material in the backside recesses 43 constitutes an electrically conductive layer 46. Each electrically conductive layer 46 can be a conductive line structure.

Each electrically conductive layer 46 can function as a combination of a plurality of control gate electrodes and a word line electrically connecting, i.e., electrically shorting, the plurality of control gate electrodes. The plurality of control gate electrodes within each electrically conductive layer 46 can include control gate electrodes located at the same level for the vertical memory devices including the memory stack structures 55. In other words, each electrically conductive layer 46 can be a word line that functions as a common control gate electrode for the plurality of vertical memory devices.

An insulating spacer 74 can be formed on the sidewalls of the backside contact trench 79 by deposition of a contiguous dielectric material layer and an anisotropic etch of its horizontal portions. Each insulating spacer 74 can be formed on a sidewall of the backside contact trench 79 and on a periphery of a top surface of the semiconductor substrate (9, 10) underneath the backside contact trench 79. The insulating spacer 74 includes a dielectric material, which can comprise, for example, silicon oxide, silicon nitride, a dielectric metal oxide, a dielectric metal oxynitride, or a combination thereof. The thickness of the insulating spacer 74, as measured at a bottom portion thereof, can be in a range from 1 nm to 50 nm, although lesser and greater thicknesses can also be employed. In one embodiment, the thickness of the insulating spacer 74 can be in a range from 3 nm to 10 nm.

A photoresist layer (not shown) can be applied over the topmost layer of the exemplary structure (which can be, for example, the dielectric pillar material layer 73) and in the cavity laterally surrounded by the insulating spacer 74, and is lithographically patterned to form various openings in a peripheral device region. The locations and the shapes of the various openings are selected to correspond to electrical nodes of the semiconductor devices in the peripheral device region 200 to be electrically contacted by contact via structures. An anisotropic etch is performed to etch through the various layers overlying the electrical nodes of the semiconductor devices. For example, at least one gate via cavity can be formed such that the bottom surface of each gate via cavity is a surface of a gate electrode (152, 154), and at least one active region via cavity can be formed such that the bottom surface of each active region via cavity is a surface of an active region 130. In one embodiment, different types of via cavities can be formed separately employing multiple combinations of photoresist layers and anisotropic etch processes. The photoresist layer can be subsequently removed, for example, by ashing.

The same photoresist layer, or another photoresist layer (not shown) applied over the exemplary structure, can be lithographically patterned to form openings within the contact region 300 in which formation of contact via structures for the electrically conductive layers 46 is desired. Control gate contact via cavities can be formed through the retro-stepped dielectric material portion 65 by transfer of the pattern of the opening by an anisotropic etch. Each via cavity can vertically extend to a top surface of a respective electrically conductive layer 46.

In addition, the same photoresist layer, or another photoresist layer (not shown) applied over the exemplary structure, can be lithographically patterned to form openings that overlie the array of drain regions 63 in the device region 100. Drain contact via cavities can be formed through the dielectric pillar material layer 73 and the at least one dielectric cap layer 71.

The cavity laterally surrounded by the insulating spacer 74, the various via cavities in the peripheral device region 200, the control gate contact via cavities in the contact region 300, and the drain contact via cavities in the device region 100 can be filled with a conductive material to form various contact via structures. For example, a backside contact via structure 76 can be formed in the cavity surrounded by the insulating spacer 74. Each backside contact via structure 76 can be formed on an inner sidewall of an insulating spacer 74. A gate contact via structure 8G can be formed in each gate via cavity in the peripheral device region 200. An active region via structure 8A is formed in each active region via cavity in the peripheral device region 200. Drain contact via structures 88 can be formed in the drain contact via cavities in the device region 100. Further, control gate contact via structures 8C can be formed within each contact via cavity that extends to a top surface of the electrically conductive layers 46 in the contact region 300.

The exemplary structure can include a monolithic three-dimensional memory device. The monolithic three-dimensional memory device comprises a substrate (9, 10) including a semiconductor material layer 10 comprising a semiconductor material; a stack of alternating layers comprising insulator layers 32 and electrically conductive layers 46 and located over the semiconductor substrate (9, 10); a memory opening 49 extending through the stack (32, 46); a memory film 50 located within the memory opening 49; and a metal-semiconductor alloy region 14 located within the semiconductor material layer 10 and contacting a vertical semiconductor channel 60 located within the memory film 50. In one embodiment, the vertical semiconductor channel 60 comprises a vertically extending tubular portion having a vertical thickness vt (See FIG. 3H and FIG. 4F), and a horizontal portion contacting a top surface of the metal-semiconductor alloy region 14 and having a horizontal thickness ht (See FIG. 3H and FIG. 4F); and the horizontal thickness ht is less than the vertical thickness vt.

In one embodiment, a side interface 14a between the semiconductor material layer 10 (or layer 9 if layer 10 is omitted) and the metal-semiconductor alloy region 14 can be substantially vertical, and can be laterally offset from a sidewall of an opening through a horizontal portion 50h (See FIG. 3G and FIG. 3E) of the memory film 50. The metal-semiconductor alloy region 14 comprises an alloy of the semiconductor material and at least one metal element. The at least one metal element can consist of a single metal element, or can comprise a plurality of metal elements. In one embodiment, the metal-semiconductor alloy region 14 can comprise a variable composition of a first metal element (e.g., W) and a different second metal element (e.g., Ru) that are among the plurality of metal elements. In one embodiment, described above with respect to FIGS. 4A-4F, the atomic concentration of the first metal element decreases with a distance from an interface between the semiconductor material layer 10 and the metal-semiconductor alloy region 14; and the atomic concentration of the second, different metal element increases with the distance from the interface between the semiconductor material layer 10 and the metal-semiconductor alloy region 14. In one embodiment, the metal-semiconductor alloy region 14 can comprise a metal silicide of the at least one metal element (or two different silicides, such as tungsten silicide and ruthenium silicide).

In one embodiment, the semiconductor substrate (9, 10) can comprise a silicon substrate, and the vertical NAND memory device can comprise an array of monolithic three-dimensional NAND strings over the silicon substrate. At least one memory cell in the first device level of the array of monolithic three-dimensional NAND strings can be located over another memory cell in the second device level of the array of monolithic three-dimensional NAND strings. The silicon substrate can contain an integrated circuit comprising a driver circuit for the memory device located thereon.

In one embodiment, the array can comprise a plurality of semiconductor channels, which comprise the combination of a surface portion of the semiconductor material layer 10 between the source region 61 and the vertical semiconductor channels 60. At least one end portion of each of the plurality of vertical semiconductor channels, i.e., the vertical semiconductor channels 60, extends substantially perpendicular to a top surface of the semiconductor substrate (9, 10). A plurality of charge storage elements is provided within each memory film 50. Each charge storage element can be located adjacent to a respective one of the plurality of vertical semiconductor channels. A plurality of control gate electrodes, as embodied as electrically conductive layers 46, is provided. Each control gate electrode can have a strip shape extending substantially parallel to the top surface of the semiconductor substrate (9, 10). In one embodiment, the plurality of control gate electrodes comprises at least a first control gate electrode located in the first device level and a second control gate electrode located in the second device level.

While the present disclosure is described employing an embodiment in which a metal-semiconductor alloy region 14 is at least partially embedded in, and contacts, a semiconductor material of a substrate as embodied in a semiconductor material layer 10 located over a substrate semiconductor layer 9 (such as a silicon wafer), the structure of the methods of the present disclosure can be practiced in any other suitable configuration. For example, the semiconductor material of the substrate may comprise at least one of: (i) an upper portion of a semiconductor wafer (e.g., of a silicon wafer) 9, (ii) a semiconductor material layer 10 located over an upper portion of a non-semiconductor substrate (e.g., forming a silicon on insulator substrate), (iii) a doped semiconductor well (e.g., p-well) 10 located in a semiconductor wafer 9, (iv) a doped semiconductor well (e.g., p-well) located in a semiconductor material layer 10 over an upper portion of a semiconductor wafer 9 or over an upper portion of a non-semiconductor substrate, (v) a doped semiconductor source line (e.g., n-well) 10 located in an upper portion of a semiconductor wafer 9, or (vi) a doped semiconductor source line (e.g., n-well) located in a semiconductor material layer 10 located over an upper portion of a semiconductor wafer or over an upper portion of a non-semiconductor substrate.

The semiconductor channel of the present disclosure can provide a lower resistance compared to prior art semiconductor channels known in the art. Specifically, the metal-semiconductor alloy region 14 reduces interfacial resistance between a horizontal portion of a semiconductor channel (e.g., when a portion of the semiconductor material layer 10 comprises a p-well between a source region 61 and the metal-semiconductor alloy region 14) and the vertical semiconductor channel 60, or between the doped semiconductor source line (e.g., when a portion of the semiconductor material layer 10 comprises an n-well source line between a source region 61 and the metal-semiconductor alloy region 14) and the vertical semiconductor channel 60.

Furthermore, the vertical semiconductor channel 60 can be formed by a single semiconductor material deposition process without employing a stack of two semiconductor material layers as known in the art. The vertical semiconductor channel 60, which is derived from a single semiconductor material layer without any vertical interface within it, can have a large average grain size, less grain boundaries, less scattering during charge carrier transport, and a higher transconductance to provide a greater on-current when the vertical transistor string is turned on. Therefore, the single layer channel avoids the presence of an interface between two silicon channel layers which is a source of large number of defects which limits channel mobility. Thus, the single layer channel has a higher mobility and therefore may be made sufficiently thin (e.g., 10 nm or less thickness, such as 8-9 nm) to leave room in the memory opening for other layers without compromising the cell current.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A monolithic three-dimensional memory device, comprising:
   a substrate including a semiconductor material;
   a stack of alternating layers comprising insulator layers and electrically conductive layers located over the semiconductor material of the substrate;
   a memory opening extending through the stack;
   a semiconductor channel located within the memory opening;
   a memory film located within the memory opening; and
   a metal-semiconductor alloy region which is located between and contacts the semiconductor material of the substrate and the semiconductor channel,
   wherein:
   the metal-semiconductor alloy region comprises an alloy of the semiconductor material and at least one metal element;
   the at least one metal element comprises a plurality of metal elements;
   the metal-semiconductor alloy region comprises a variable composition of a first metal element and a second metal element that are among the plurality of metal elements;
   a concentration of the first metal element decreases with a distance from an interface between the semiconductor material of the substrate and the metal-semiconductor alloy region; and
   a concentration of the second metal element increases with the distance from the interface between the semiconductor material of the substrate and the metal-semiconductor alloy region.

2. The monolithic three-dimensional memory device of claim 1, wherein:
the semiconductor channel comprises a vertically extending tubular portion located within the memory film, and a horizontal portion having a horizontal thickness and contacting a top surface of the metal-semiconductor alloy region; and
the semiconductor material of the substrate comprises at least one of:
an upper portion of a semiconductor wafer;
a semiconductor material layer located over an upper portion of the semiconductor wafer or over an upper portion of a non-semiconductor substrate;
a doped semiconductor well in the semiconductor wafer or in the semiconductor material layer; or
a doped semiconductor source line located in the semiconductor wafer or in the semiconductor material layer.

3. The monolithic three-dimensional memory device of claim 1, wherein:
a vertical interface between the semiconductor material of the substrate and the metal-semiconductor alloy region is laterally offset from a sidewall of an opening through a horizontal portion of the memory film; and
the metal-semiconductor alloy region is at least partially embedded within semiconductor material of the substrate.

4. The monolithic three-dimensional memory device of claim 1, wherein the at least one metal element is selected from cobalt, ruthenium, and tungsten, the semiconductor material comprises silicon, and the metal-semiconductor alloy region comprises a metal silicide of the at least one metal element.

5. The monolithic three-dimensional memory device of claim 1, wherein at least a portion of an interface between the metal-semiconductor alloy region and the semiconductor channel is located above a bottom surface of the memory film.

6. The monolithic three-dimensional memory device of claim 5, wherein:
a first portion of the metal-semiconductor alloy region extending through an opening in a horizontal portion of the memory film has a first width;
a second portion of the metal-semiconductor alloy region located below the bottom surface of the memory film has a second width; and
the second width is greater than the first width.

7. The monolithic three-dimensional memory device of claim 6, wherein a periphery of the interface between the metal-semiconductor alloy region and the semiconductor channel either contacts a sidewall of the opening in the horizontal portion of the memory film or is located above the horizontal portion of the memory film.

8. The monolithic three-dimensional memory device of claim 1, wherein:
the monolithic three-dimensional memory device is a vertical NAND memory device;
the electrically conductive layers comprise, or are electrically connected to, a respective word line of the vertical NAND memory device;
the substrate comprises a silicon substrate;
the vertical NAND memory device comprises an array of monolithic three-dimensional NAND strings over the silicon substrate;
at least one memory cell in the first device level of the three-dimensional array of NAND strings is located over another memory cell in the second device level of the three-dimensional array of NAND strings;
the silicon substrate contains an integrated circuit comprising a driver circuit for the memory device located thereon; and
the three-dimensional array of NAND strings comprises:
a plurality of semiconductor channels, wherein at least one end portion of each of the plurality of semiconductor channels includes a semiconductor channel that extends substantially perpendicular to a top surface of the substrate; and
a plurality of charge storage elements, each charge storage element located adjacent to a respective one of the plurality of semiconductor channels.

9. A method of manufacturing a three-dimensional memory device, comprising:
forming a stack of alternating layers comprising first material layers and second material layers over a substrate that includes a semiconductor material;
forming a memory opening extending through the stack;
forming a memory film in the memory opening;
forming at least one metallic material on the semiconductor material of the substrate;
forming a semiconductor channel in the memory opening; and
forming a metal-semiconductor alloy region by reacting the at least one metallic material with a portion of the semiconductor material of the substrate,
wherein:
the metal-semiconductor alloy region is formed between, and contacts, the semiconductor material of the substrate and the semiconductor channel;
the first material layers comprise insulating layers;
the second material layers are replaced with electrically conductive layers to form a stack of alternating layers comprising the insulating layers and the electrically conductive layers;
the metal-semiconductor alloy region comprises an alloy of the semiconductor material and at least one metal element;
the at least one metal element comprises a plurality of metal elements;
the metal-semiconductor alloy region comprises a variable composition of a first metal element and a second metal element that are among the plurality of metal elements;
a concentration of the first metal element decreases with a distance from an interface between the semiconductor material of the substrate and the metal-semiconductor alloy region; and
a concentration of the second metal element increases with the distance from the interface between the semiconductor material of the substrate and the metal-semiconductor alloy region.

10. The method of claim 9, further comprising recessing a portion of the semiconductor material of the substrate underneath the memory opening to form a recess region after forming the memory film.

11. The method of claim 10, wherein:
forming the at least one metallic material comprises selectively depositing at least one metallic material on the semiconductor material of the substrate in the recess region while preventing depositing the at least one metallic material over the stack; and
forming the semiconductor channel comprises a single semiconductor material deposition process that is performed after forming the recess region and before forming the metal-semiconductor alloy region.

12. The method of claim 11, wherein:

the single semiconductor material deposition process comprises an amorphous silicon layer deposition process; and forming the metal-semiconductor alloy region comprises a rapid thermal anneal which reacts the at least one metallic material with a portion of the semiconductor material of the substrate and with the amorphous silicon layer to form the metal semiconductor alloy region which comprises a silicide region, and which converts the amorphous silicon layer to a polysilicon semiconductor channel.

13. The method of claim 11, wherein forming the memory film in the memory opening comprises forming a layer stack including at least a memory material layer and a tunneling dielectric layer in the memory opening.

14. The method of claim 13, further comprising:

forming a sacrificial dielectric material layer on a physically exposed surface of the tunneling dielectric layer;

forming a sacrificial non-conformal material layer over the stack of alternating layers; and anisotropically etching a horizontal bottom portion of the layer stack at a bottom portion of the memory opening and the portion of the semiconductor material of the substrate underneath the memory opening employing the sacrificial non-conformal material layer as an etch mask to form the recess region.

15. The method of claim 14, further comprising removing the sacrificial dielectric material layer and the sacrificial non-conformal material layer prior to forming the at least one metallic material and after the step of anisotropically etching.

16. The method of claim 14, wherein:

the at least one metallic material does not grow from a physically exposed surface of the tunneling dielectric layer during selective deposition of the at least one metallic material; and the sacrificial non-conformal material layer and the sacrificial dielectric layer comprise carbon layers.

17. The method of claim 14, further comprising removing the sacrificial dielectric material layer and the sacrificial non-conformal material layer after forming the at least one metallic material and after the step of anisotropically etching.

18. The method of claim 17, wherein:

the at least one metallic material does not grow from the sacrificial non-conformal material layer and the sacrificial dielectric layer during selective deposition of the at least one metallic material; and the sacrificial non-conformal material layer and the sacrificial dielectric layer comprise carbon.

19. The method of claim 18, further comprising:

forming a second metallic material on the at least one metallic material after removing the sacrificial dielectric material layer and the sacrificial non-conformal material layer, and before forming the semiconductor channel; and forming a metal-semiconductor alloy region by reacting the at least one metallic material with the portion of the semiconductor material of the substrate and reacting the second metallic material with the semiconductor channel;

wherein the second metallic material is different from the at least one metallic material.

20. The method of claim 14, wherein:

the sacrificial dielectric material layer comprises a material selected from amorphous carbon and diamond-like carbon (DLC); and forming the semiconductor channel on the memory film occurs after removing the sacrificial dielectric material layer.

21. The method of claim 9, wherein:

the at least one metallic material comprises one or more metal elements selected from cobalt, ruthenium, and tungsten;

the semiconductor material comprises silicon;

the metal-semiconductor alloy region comprises a metal silicide of the at least one metal element; and the semiconductor material of the substrate comprises at least one of an upper portion of a semiconductor wafer, a semiconductor material layer located over an upper portion of the semiconductor wafer or over an upper portion of a non-semiconductor substrate, a doped semiconductor well in the semiconductor wafer or in the semiconductor material layer, or a doped semiconductor source line located in the semiconductor wafer or in the semiconductor material layer.

22. The method of claim 9, wherein:

the monolithic three-dimensional memory device comprises a vertical NAND memory device;

the electrically conductive layers comprise, or are electrically connected to, a respective word line of the vertical NAND memory device;

the substrate comprises a silicon substrate;

the vertical NAND memory device comprises an array of monolithic three-dimensional NAND strings over the silicon substrate;

at least one memory cell in the first device level of the three-dimensional array of NAND strings is located over another memory cell in the second device level of the three-dimensional array of NAND strings;

the silicon substrate contains an integrated circuit comprising a driver circuit for the memory device located thereon; and the array of monolithic three-dimensional NAND strings comprises:

a plurality of semiconductor channels, wherein at least one end portion of each of the plurality of semiconductor channels includes a semiconductor channel that extends substantially perpendicular to a top surface of the substrate; and a plurality of charge storage elements, each charge storage element located adjacent to a respective one of the plurality of semiconductor channels.

* * * * *